(12) United States Patent
Swanson et al.

(10) Patent No.: US 7,388,733 B2
(45) Date of Patent: Jun. 17, 2008

(54) METHOD FOR MAKING NOBLE METAL CONDUCTIVE LEADS FOR SUSPENSION ASSEMBLIES

(75) Inventors: Kurt C. Swanson, Hutchinson, MN (US); Jeffrey Wang, Hutchinson, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 0 days.

(21) Appl. No.: 11/551,985

(22) Filed: Oct. 23, 2006

(65) Prior Publication Data

US 2007/0041123 A1    Feb. 22, 2007

Related U.S. Application Data

(62) Division of application No. 11/129,190, filed on May 13, 2005, now Pat. No. 7,142,395.

(60) Provisional application No. 60/571,476, filed on May 14, 2004.

(51) Int. Cl.
*G11B 5/48* (2006.01)
*G11B 21/16* (2006.01)

(52) U.S. Cl. ................................. 360/245.9; 360/244.3

(58) Field of Classification Search ............. 360/245.9, 360/244.3, 245.4, 245.8, 245.2, 244.9
See application file for complete search history.

(56) References Cited

U.S. PATENT DOCUMENTS

| | | | |
|---|---|---|---|
| 5,427,848 A | 6/1995 | Baer et al. | |
| 5,666,717 A | 9/1997 | Matsumoto et al. | |
| 5,986,853 A | 11/1999 | Simmons et al. | |
| 6,399,899 B1 | 6/2002 | Ohkawa et al. | |
| 6,596,184 B1 | 7/2003 | Shum et al. | |
| 6,714,384 B2 | 3/2004 | Himes et al. | |
| 6,714,385 B1 | 3/2004 | Even et al. | |
| 6,735,052 B2 | 5/2004 | Dunn et al. | |
| 6,762,913 B1 | 7/2004 | Even et al. | |
| 6,841,737 B2 | 1/2005 | Komatsubara | |
| 6,942,817 B2 | 9/2005 | Yagi et al. | |
| 7,129,418 B2 | 10/2006 | Aonuma et al. | |
| 7,142,395 B2 * | 11/2006 | Swanson et al. | ......... 360/245.9 |

FOREIGN PATENT DOCUMENTS

| | | | |
|---|---|---|---|
| JP | 09198825 A | | 7/1997 |
| JP | 11039627 A | * | 2/1999 |
| JP | 2000357311 A | * | 12/2000 |
| JP | 2001202731 A | | 7/2001 |
| JP | 2001344722 A | * | 12/2001 |
| JP | 2004039056 A | | 2/2004 |

* cited by examiner

*Primary Examiner*—William J Klimowicz
(74) *Attorney, Agent, or Firm*—Faegre & Benson LLP

(57) ABSTRACT

A method of manufacturing an integrated lead head suspension flexure of the type having conductors on a spring metal layer capable of being etched by a first etching process. The method includes forming a patterned layer having gaps one or more flying lead regions of dielectric material on a major surface of the spring metal layer and forming one or more conductive leads on the flexure, including onto the dielectric material and over exposed spring metal at the gap at each flying lead region. At least the flying lead portion of the conductive lead is formed from conductive material resistant to the first etching process. The method also includes etching a flying lead region of the spring metal layer to remove a portion of the spring metal layer in the flying lead region and expose the flying lead portions of the conductive lead.

8 Claims, 31 Drawing Sheets

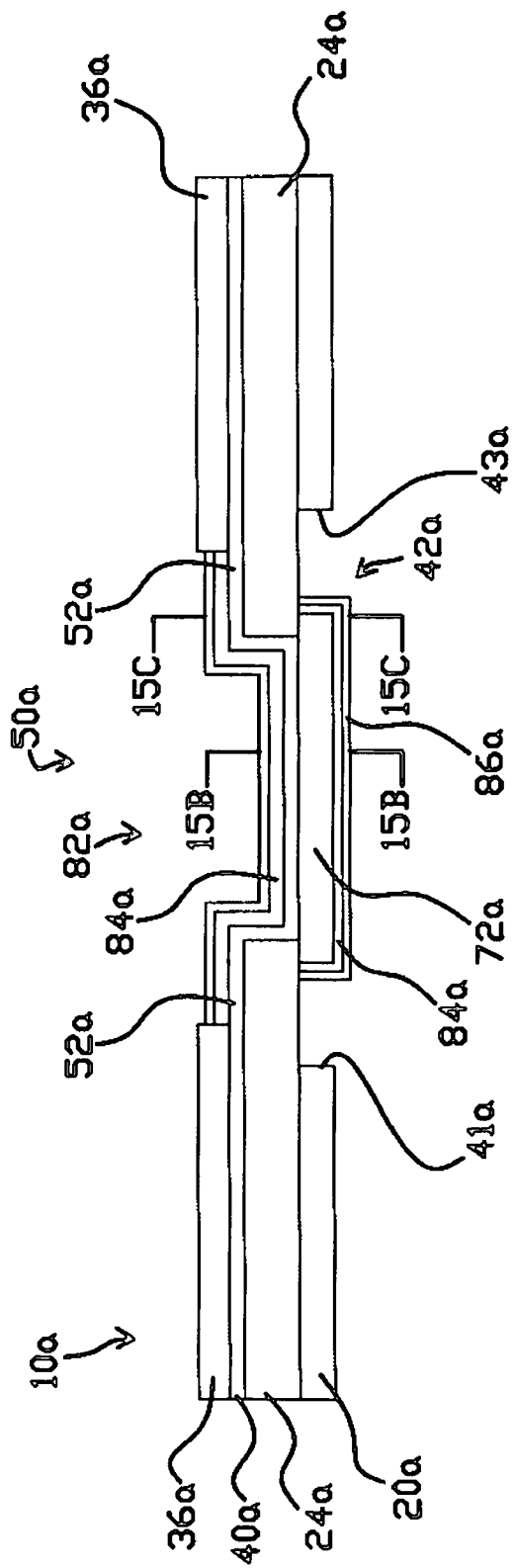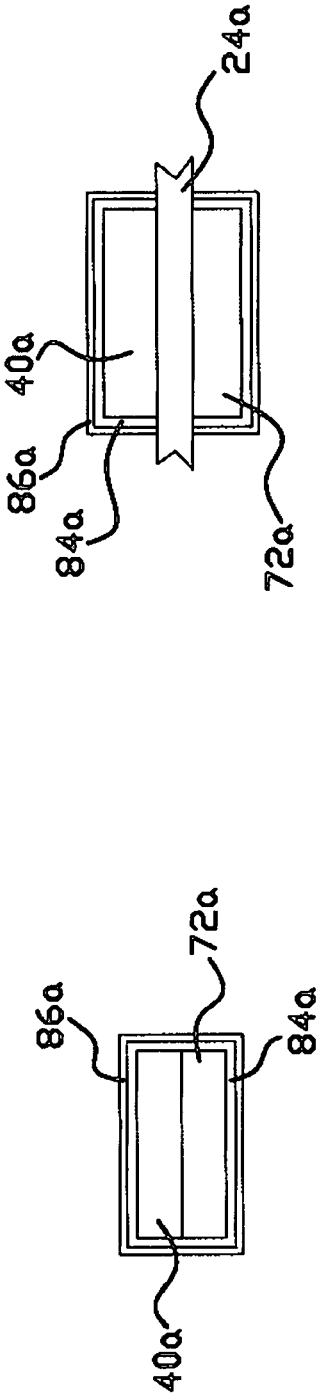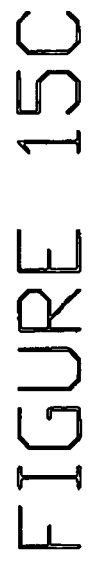

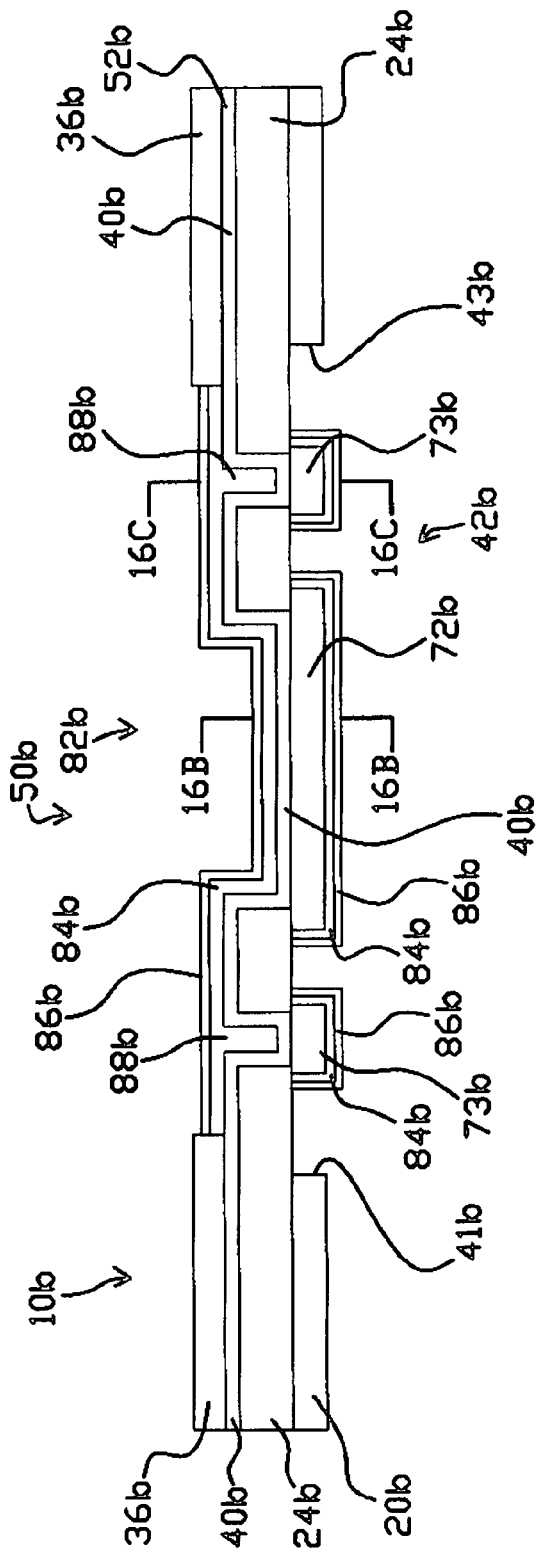
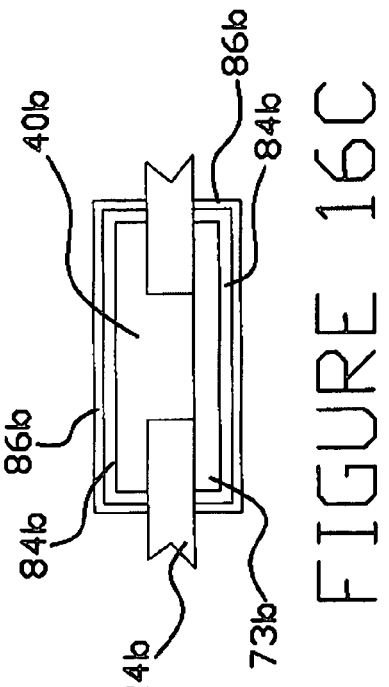
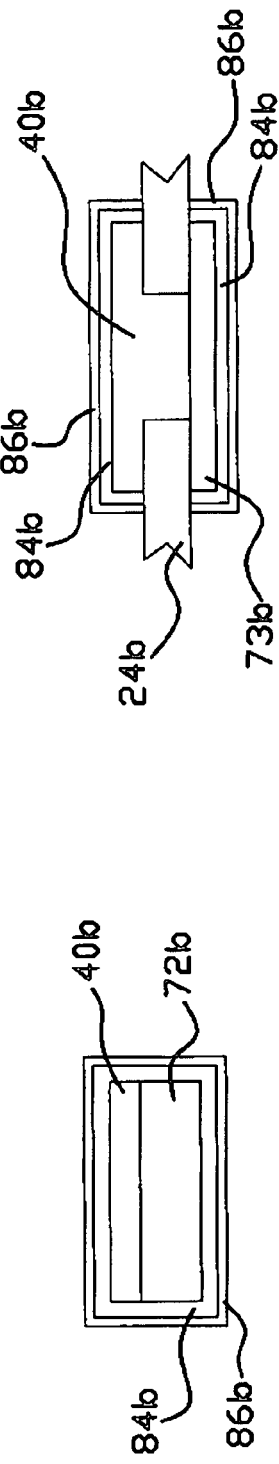

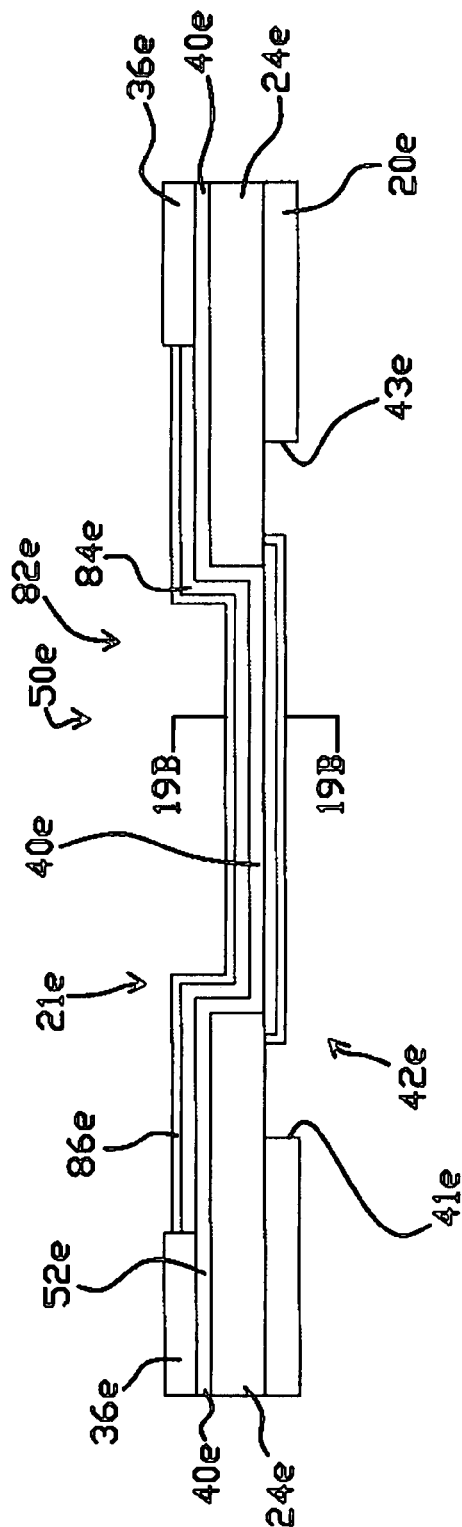
FIGURE 19A
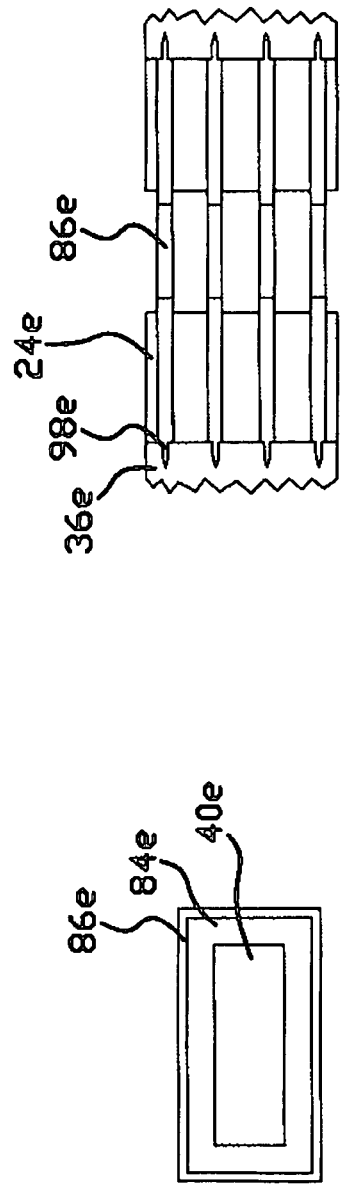
FIGURE 19C
FIGURE 19B

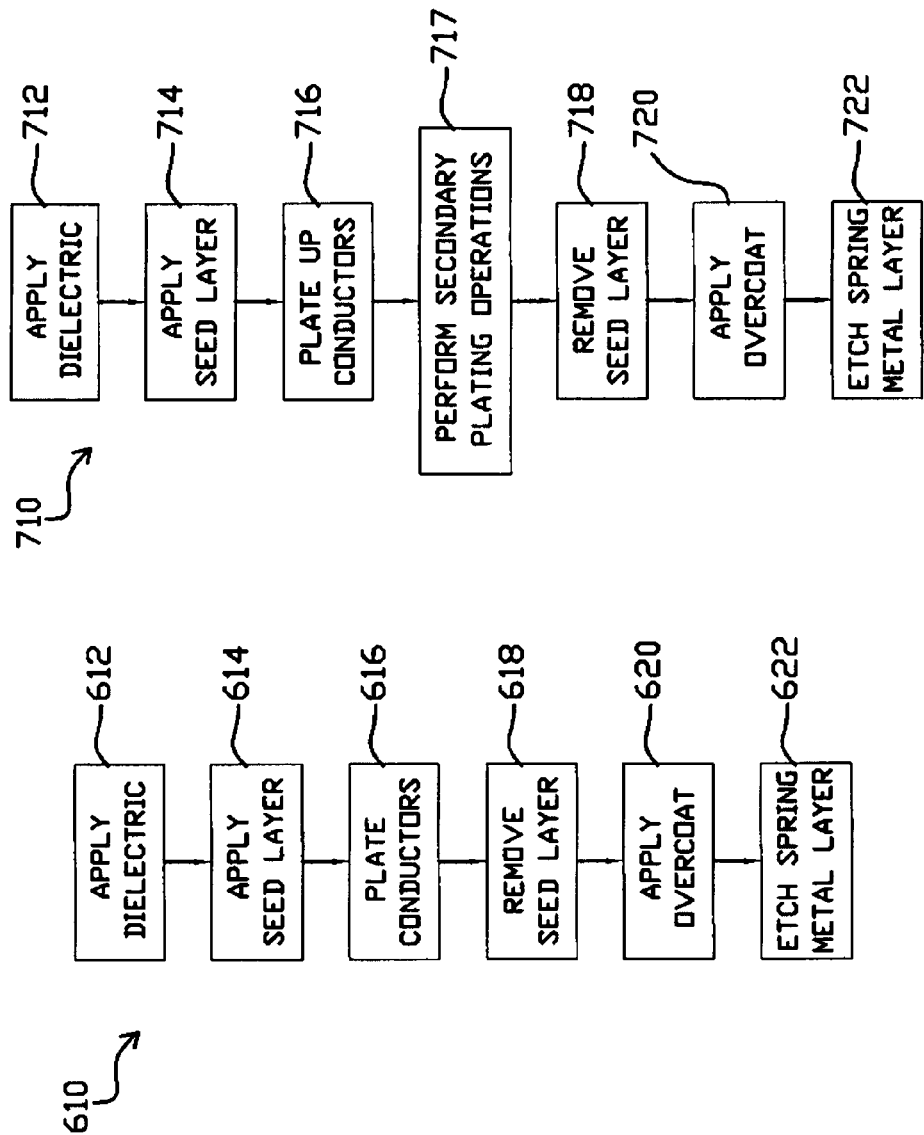

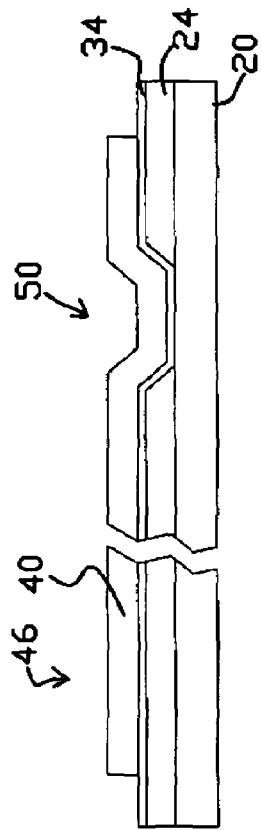
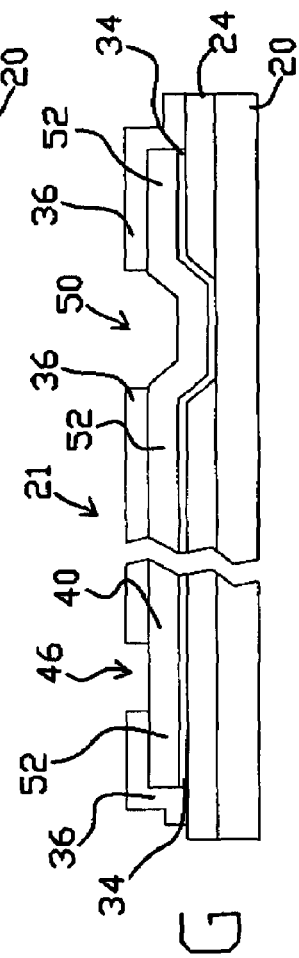
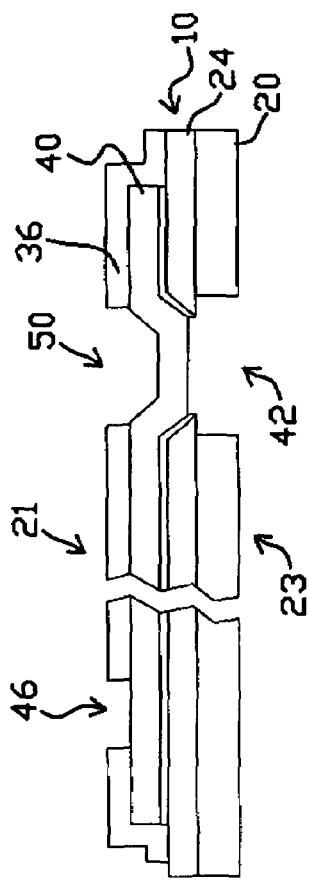
FIGURE 21E
FIGURE 21F
FIGURE 21G
FIGURE 21H

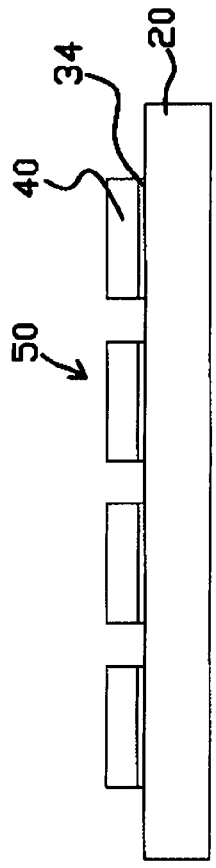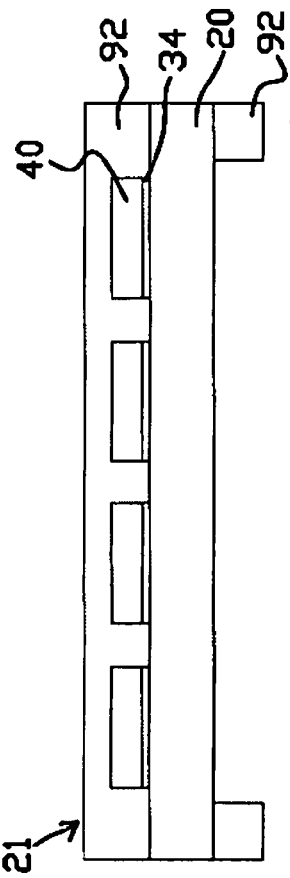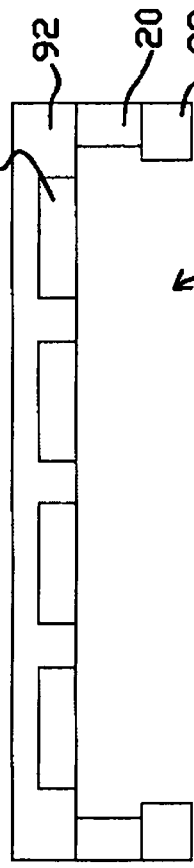
FIGURE 21I
FIGURE 21J
FIGURE 21K
FIGURE 21L

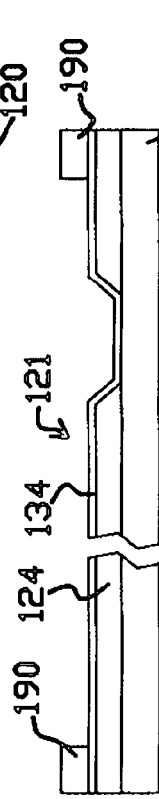
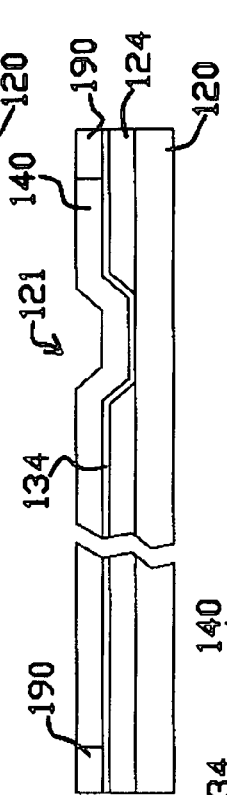
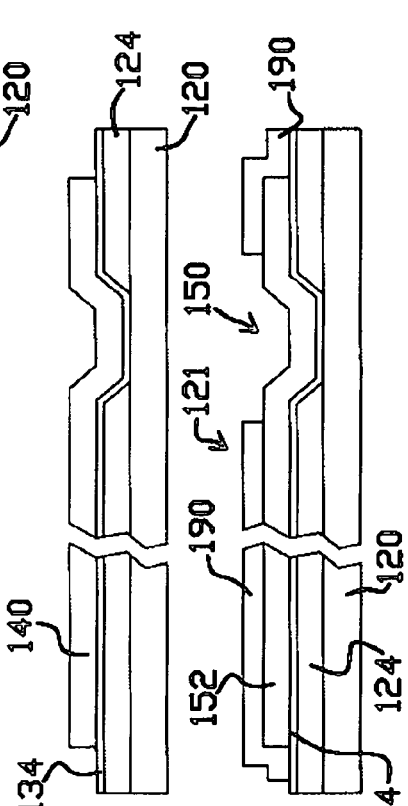

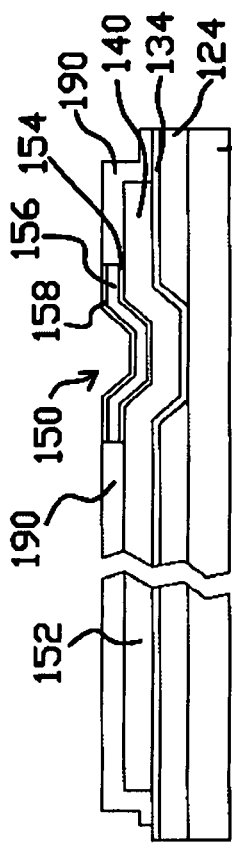
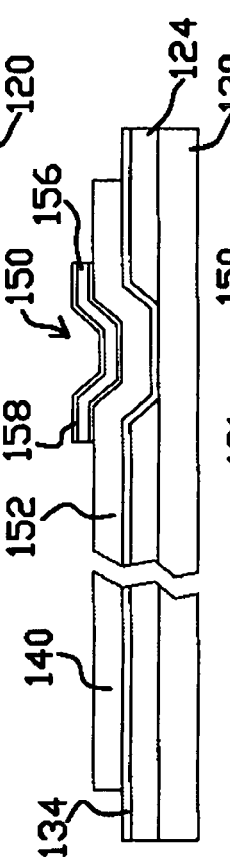
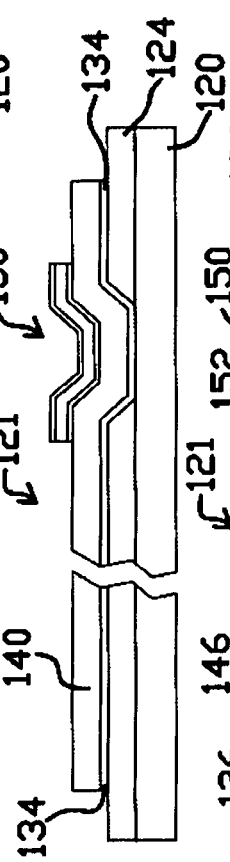
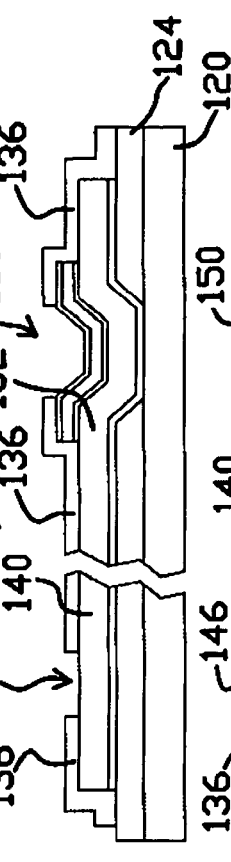
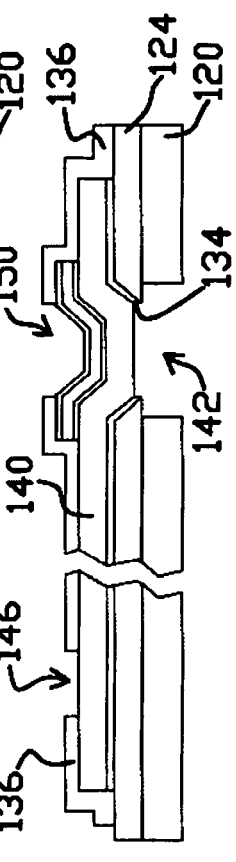
FIGURE 23G
FIGURE 23H
FIGURE 23I
FIGURE 23J
FIGURE 23K

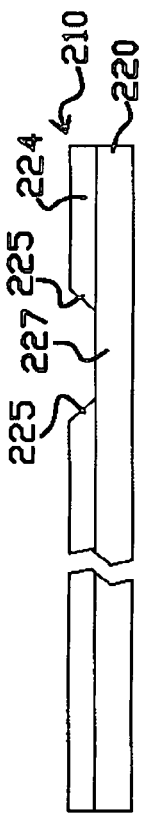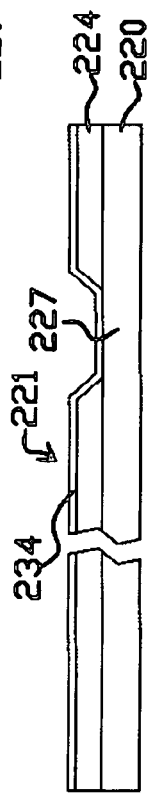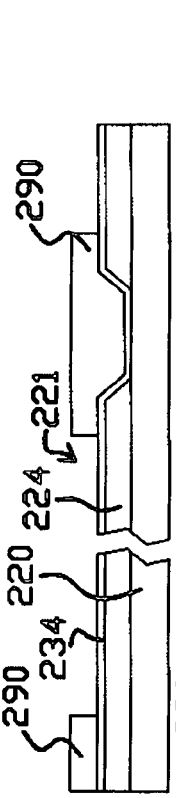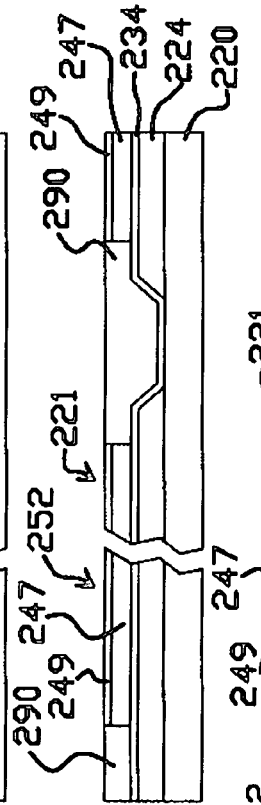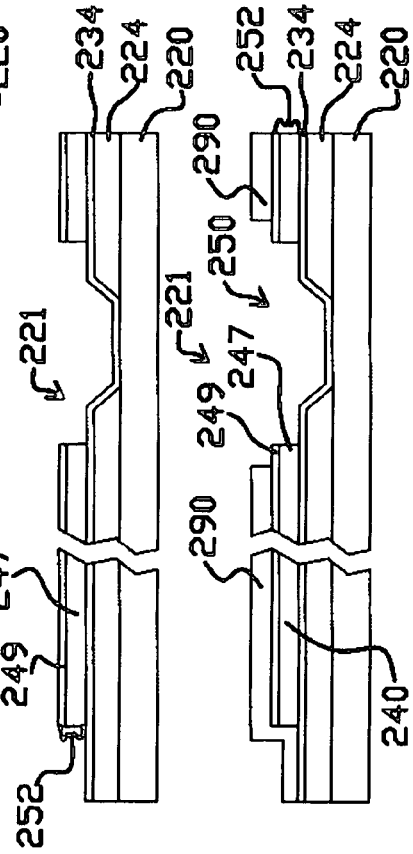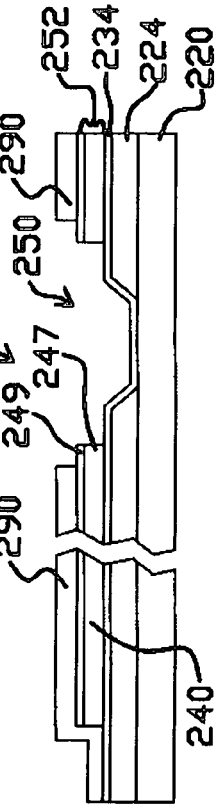
FIGURE 25A
FIGURE 25B
FIGURE 25C
FIGURE 25D
FIGURE 25E
FIGURE 25F

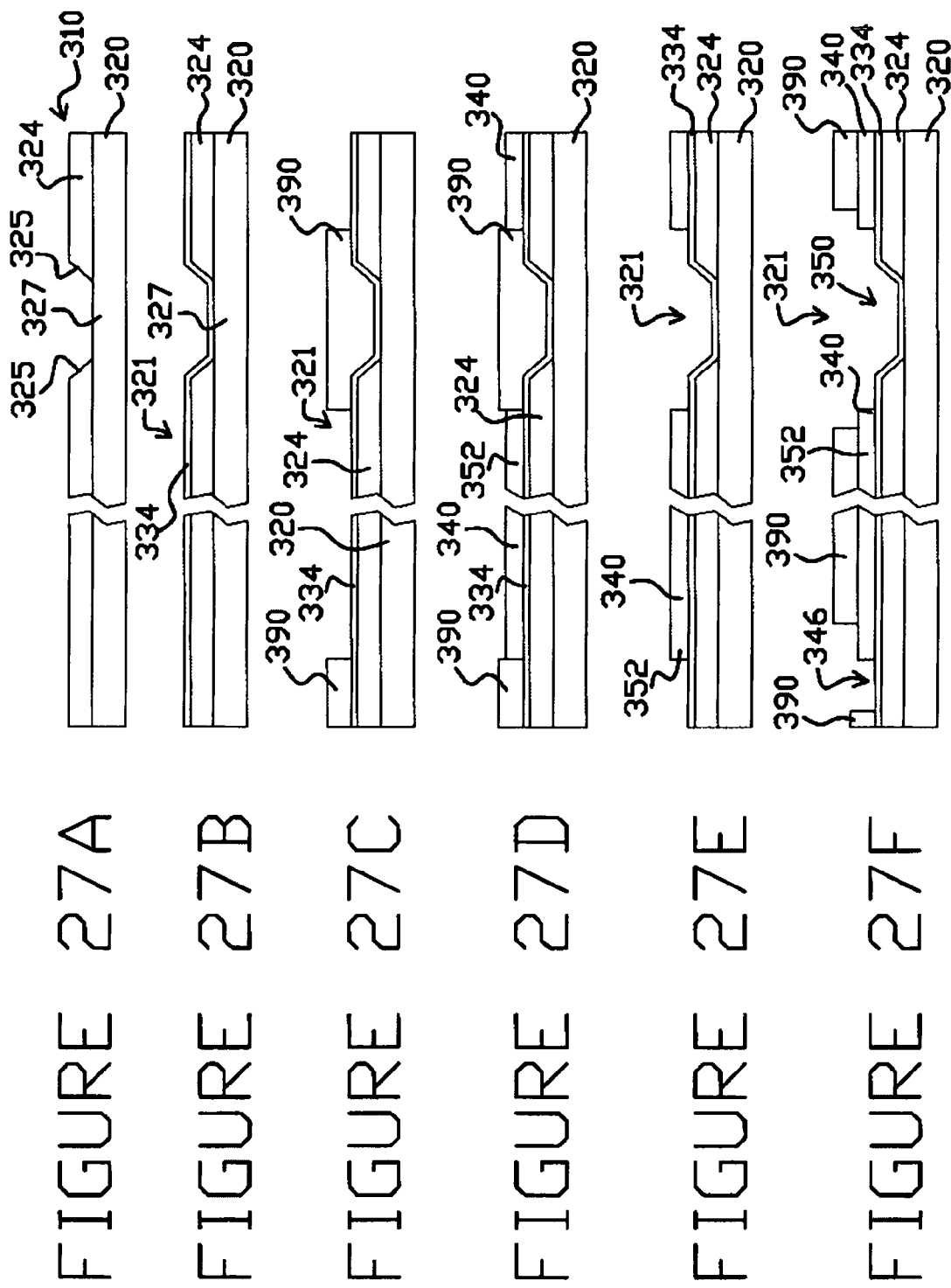

METHOD FOR MAKING NOBLE METAL CONDUCTIVE LEADS FOR SUSPENSION ASSEMBLIES

REFERENCE TO RELATED APPLICATION

This application is a division of U.S. patent application Ser. No. 11/129,190, filed May 13, 2005, and entitled Method for Making Noble Metal Conductive Leads for Suspension Assemblies, now U.S. Pat. No. 7,142,395, issued Nov. 28, 2006, which claims the benefit of U.S. Provisional Application No. 60/571,476, filed May 14, 2004 and entitled Additive Process for Manufacturing Suspensions with Noble Metal Conductors, both of which are hereby incorporated by reference in their entirety.

FIELD OF THE INVENTION

The invention relates generally to magnetic disk drive head suspensions. In particular, the invention is a flexure with noble metal conductors and an additive process for manufacturing the flexure.

BACKGROUND OF THE INVENTION

Additive processes for manufacturing conductive traces on suspension components are known in the art. U.S. Pat. No. 5,666,717 issued to Matsumoto, et al. discloses an additive process for manufacturing suspensions with copper traces. U.S. Pat. No. 6,399,899 issued to Ohkawa, et al. discloses an additive process with backside access to traces. Each of these patents disclose traces made of materials that are susceptible to corrosion. In addition, the manufacturing methods taught by these references require a large number of steps leading to a process that is inefficient and requires extensive handling, making the suspension components susceptible to damage and resulting in low yield rates.

Thus, there remains, a continuing need for a process that is efficient, cost effective, and results in a suspension with corrosion resistant conductors. In addition, a need remains for high quality conductive traces that are resistant to corrosion and are resistant to damage that may result from handling or rework.

SUMMARY OF THE INVENTION

The invention is directed toward an additive process of manufacturing an integrated lead head suspension flexure of the type adapted to accept a magnetic head and having conductors on a spring metal layer. A layer of dielectric material is applied to a portion of the spring metal layer and one or more conductors are formed onto the flexure, including across a gap in the dielectric material in a flying lead region. The conductors can be formed by plating conductive material onto the flexure. The conductors can include a flying lead portion and a primary portion. The flying lead portion can be formed of the same material and at the same time as the primary lead portion. Alternatively, the flying lead portion can be formed in a separate process and be formed of different materials. The spring metal layer is capable of being etched in the flying lead region of the flexure. At least the portion of the conductive leads formed in the flying lead region are resistant to the etching process so that the flying lead portions of the conductive leads remain and are exposed by the etching process. Portions of the conductive leads may be covered with a cover layer of dielectric material, which may be applied prior to the etching process.

BRIEF DESCRIPTION OF THE DRAWINGS

FIGS. 15A-C are cross-sectional side views of an alternative embodiment of the flexure shown in FIGS. 3 and 4 having a flying lead region with an attached reinforcement member.

FIGS. 16A-C are cross-sectional side views of another alternative embodiment of the flexure shown in FIGS. 3 and 4 having a flying lead region with an alternative reinforcement member.

FIGS. 19A and B are cross-sectional side views of still another alternative embodiment of the flexure shown in FIGS. 3 and 4 having a flying lead region with an alternative reinforcement member.

FIG. 19C is a top view of the flying lead region of the flexure shown in FIG. 19A.

FIG. 20 is a flow chart outlining the steps of an additive process of manufacturing conductive leads onto the flexure shown in FIGS. 3 and 4 in accordance with one embodiment of the invention.

FIGS. 21A-L are side views of a flexure structure, illustrating the structure at sequential steps of the manufacturing process according to the flow chart of FIG. 20.

FIG. 22 is a flow chart outlining the steps of manufacturing conductive leads onto the flexure shown in FIGS. 5 and 6 in accordance with another embodiment of the invention.

FIGS. 23A-K are side views of a flexure structure, illustrating the structure at sequential steps of the manufacturing process according to the flow chart of FIG. 22.

FIGS. 25A-K are side views of a flexure structure, illustrating the structure at sequential steps of the manufacturing process according to the flow chart of FIG. 24.

FIGS. 27A-K are side views of a flexure structure, illustrating the structure at sequential steps of the manufacturing process according to the flow chart of FIG. 26.

DETAILED DESCRIPTION OF THE PREFERRED EMBODIMENTS

Figure 1:
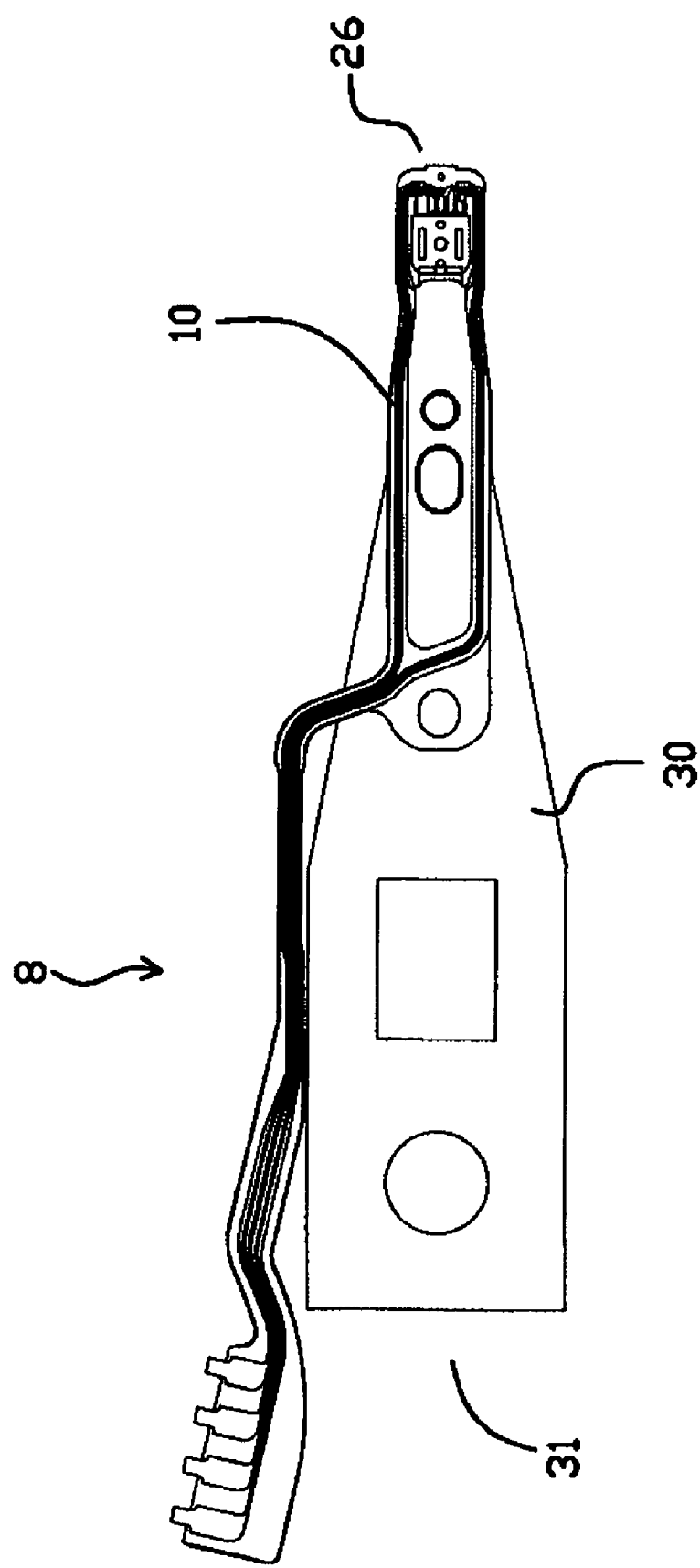
FIG. 1 is an illustration of a disk drive head suspension assembly having a flexure with noble metal conductive leads in accordance with one embodiment of the present invention.

FIG. 1 is an illustration of a head suspension assembly 8 adapted for use in a disk drive including a suspension component or flexure 10 having an array of conductive leads 40 that include noble or near noble metals and are manufactured by an additive process in accordance with one embodiment of the invention. Head suspension 8 includes a load beam 30, to which the flexure 10 is attached, the load beam having an actuator arm mounting region 38 on a proximal end 31 adapted to mount the head suspension assembly 8 to an actuator arm (not shown).

Figure 2:
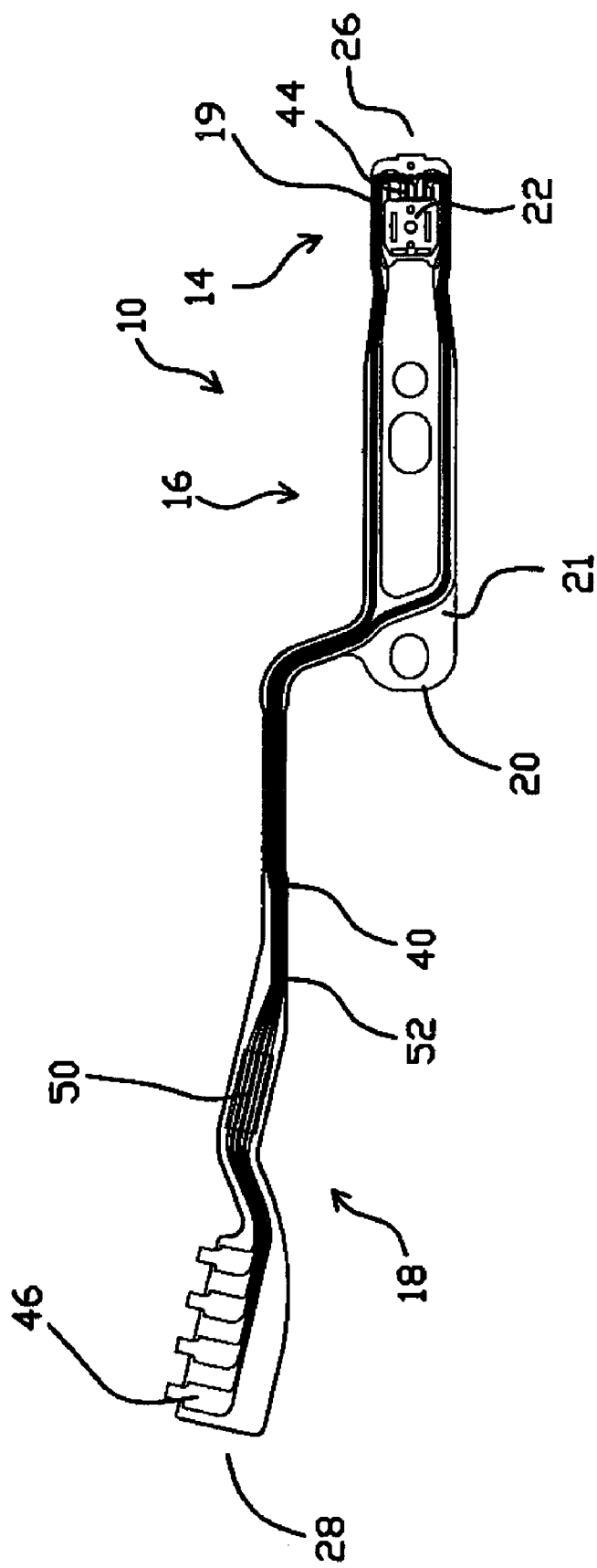
FIG. 2 is an illustration of the flexure shown in FIG. 1.

Flexure 10 is shown in greater detail in FIG. 2. Flexure 10 includes a generally flat spring metal layer 20 having a gimbal region 14 located at a distal end 26 of the flexure, a mounting region 16 for mounting the flexure to a load beam 30, and a tail region 18 extending from the mounting region at a proximal end 28 of the flexure. Spring metal layer 20 is typically made of stainless steel or another suitable material. The gimbal region 14 of flexure 10 includes a tongue 22, defined by a channel 19 formed through the spring metal layer 20, that supports a magnetic head (not shown). The mounting region 16 is adapted to engage with the load beam 30 and may include various tabs, apertures, and offsets (not shown) to facilitate attachment with the load beam (typically by welding). The spring metal layer 20 of flexure 10 can assume a variety of shapes and sizes without departing from the scope of the invention.

Flexure 10 is a so-called integrated lead or wireless structure and includes conductive traces or leads 40 that are applied to a major surface 21 of the spring metal layer 20. The conductive leads 40 provide electrical communication between the magnetic head (not shown) that is mounted on the gimbal region 14 of flexure 10 and external circuitry (not shown), which is attached to the conductive leads on the tail region 18 near the proximal end 28 of the flexure. Each conductive lead 40 includes a head bonding pad portion 44 positioned on the gimbal region 14 of flexure 10. The head bonding pad portion 44 of the conductive lead 40 is adapted to accept an attachment mechanism such as a solder ball or a gold ball to bond the magnetic head (not shown) to the conductive lead.

In addition, each conductive lead 40 includes a primary conductor portion 52, which extends along some or all of the conductive lead. The conductive lead 40 also includes a flying lead region 50, and a test pad portion 46 located on the tail region 18 of the flexure 10. The flying lead region 50 allows for access to the conductive lead 40 from both a first major surface 21 and an opposing second major surface 23 (as shown on FIG. 4). The test pad portion 46 provides access to the conductive lead 40 for testing purposes.

Figure 3:
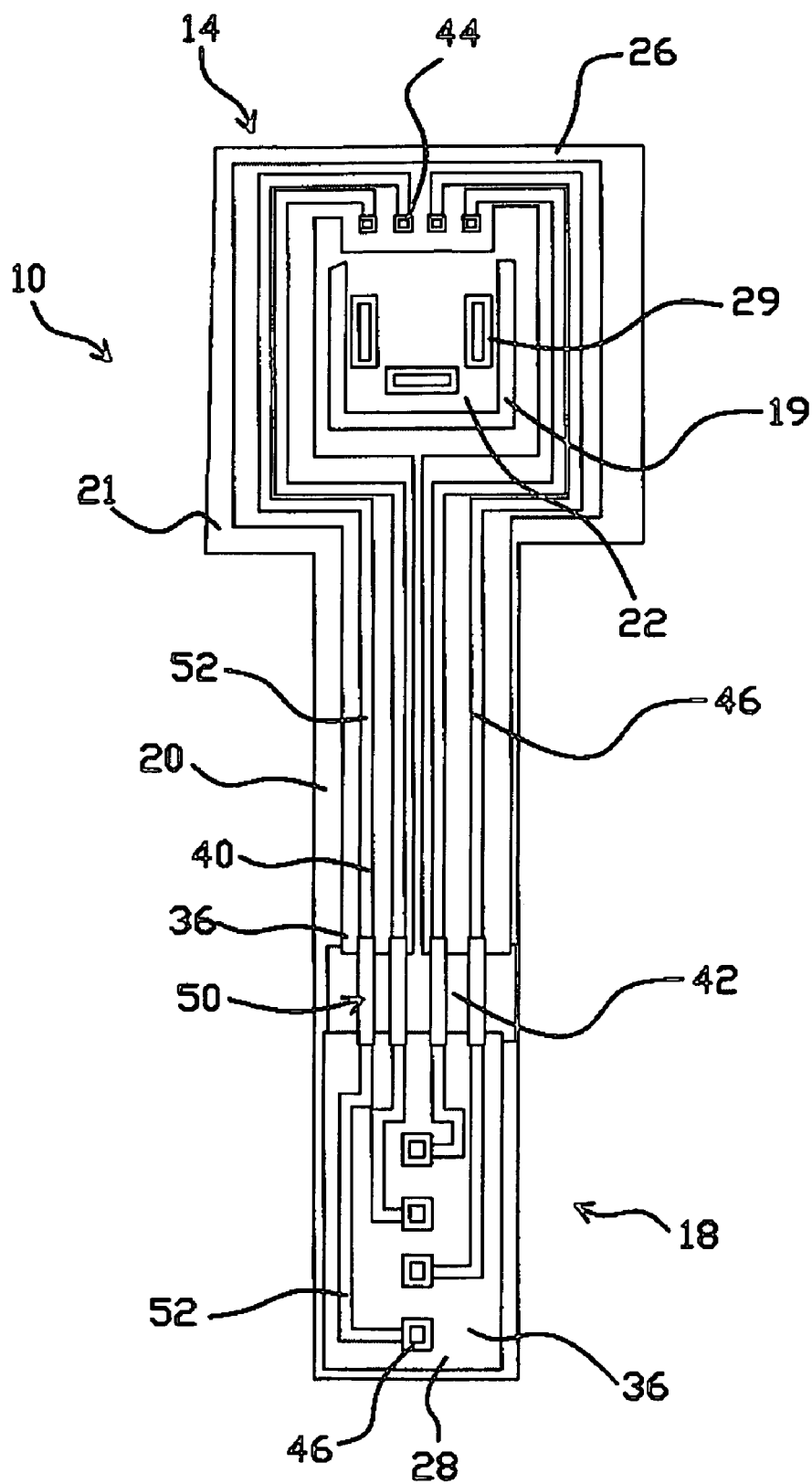
FIG. 3 is a detailed schematic representation of the flexure shown in FIG. 2.
Figure 4:
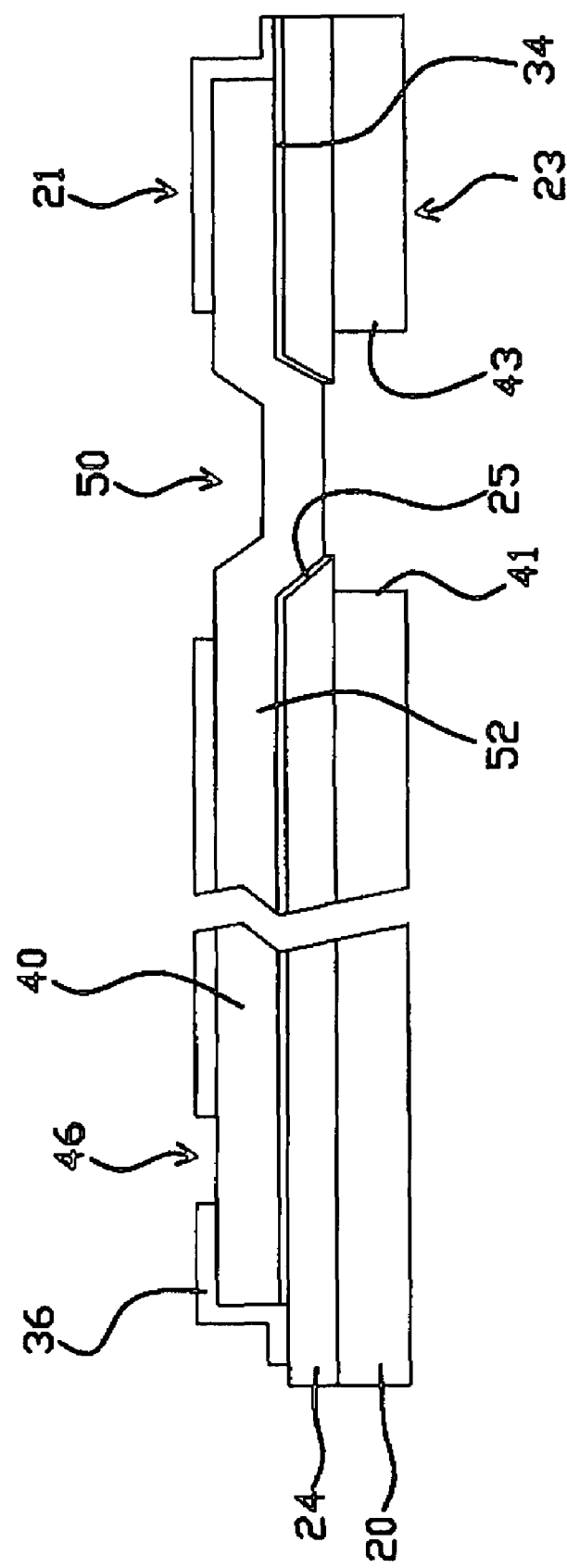
FIG. 4 is a detailed cross-sectional view side view of a portion of the flexure shown in FIG. 3, showing a flying lead region and test pad portion of one of the conductive leads.

Schematic representations of flexure 10 are shown in FIGS. 3 and 4. The conductive leads 40 are applied along the first major surface 21 of the spring metal layer 20 of flexure 10. Flexure 10 includes, along with a plurality of conductive leads 40, a dielectric layer 24, and a cover layer 36, both of which are made of a dielectric material such as a photosensitive polyimide. In one embodiment, the entire conductive lead 40 is made of gold. Gold conductive leads provide resistance to corrosion not found in commonly used metals such as copper. Cover layer 36 is applied over a majority of the conductive leads 40, but does not extend over a majority of the flying lead region 50, or over the test pad portion 46 and head bonding portion 44. Cover layer 36 provides protection for the portion of the conductive leads 40 that are covered by the cover layer.

FIG. 4 shows a side view schematic representation of a portion of the flexure 10 including the flying lead region 50 and test pad portion 46 of one of the conductive leads 40. Dielectric layer 24 is applied adjacent to the spring metal layer 20 to electrically isolate the spring metal layer from the conductive lead 40. The dielectric layer 24 extends over a portion of the aperture 42 in spring metal layer 20 on each of a first edge 41 and a second edge 43 of the aperture. The portion of the dielectric layer 24 that extends over the aperture 42 has a tapered edge 25 that is tapered toward the spring metal layer 20.

In addition, a seed layer 34 of conductive material such as chromium or other suitable material is applied to the dielectric layer 24 so that it is located between the dielectric layer 24 and the conductive lead 40, including the portion of dielectric layer with a tapered edge 25. While the dielectric material 24 can be applied over a substantial portion of the spring metal layer 20 beyond the area beneath the conductive leads 40, the seed layer 34 is preferably limited to the areas between the dielectric layer 24 and the conductive leads 40 to prevent the seed layer 34 from providing electrical communication between conductive leads 40 that are intended to be electrically isolated from each other.

The conductive lead 40 is shown with a flying lead region 50 and a test pad portion 46. While, the schematic shows the test pad portion 46 and not the head bond portion, the head bond portion have a similar or identical structure as the test pad portion and be formed with similar or identical processes. The flying lead region 50 of conductive lead 40 extends down the tapered edge 25 that extends over the aperture 42 from each of the first edge 41 and second edge 43 of the aperture and extends across the aperture 42 formed into the spring metal layer 20. The flying lead region 50 extends across but not into the aperture 42 in the illustrated embodiment. In the illustrated embodiment, the primary conductor portion 52 extends along the entire conductive lead 40, including the flying lead region 50 and the test pad portion 46.

Another feature of the flexure 10 are one or more standoffs 29 positioned on the tongue 22. The standoffs 29 extend away from the spring metal layer 20 of the flexure 10 to support and position the magnetic head slider (not shown) when it is attached to the flexure 10. The standoffs 29 can include the same layers of materials applied elsewhere on the flexure 10, including a dielectric layer 24, conductive material similar to conductive leads 40, and cover layer 36, although other materials may be used. The standoffs 29 are preferably the same thickness as the head bonding portion 44 to facilitate the attachment of the magnetic head (not shown) to the head bonding portion. In the embodiment illustrated in FIG. 3, three rectangular standoffs 29 are positioned along a perimeter of the tongue 22. The number, shape, and position of the standoffs, however, can vary without departing from the scope of the invention.

The cover layer 36 is applied over the dielectric layer 24 and the conductive leads 40 at locations other than the flying lead region 50 and the test pad portion 46, leaving the conductive leads 40 exposed in those areas. Thus, the flying lead region 50, in the illustrated embodiment, is exposed on both a first major surface 21 and a second opposing surface 23. The flying lead region 50 is preferably made of gold and has approximately the same thickness as the other portions of the conductive lead 40, although the flying lead region of the conductive lead may be wider than other portions of the conductive lead.

Figure 5:
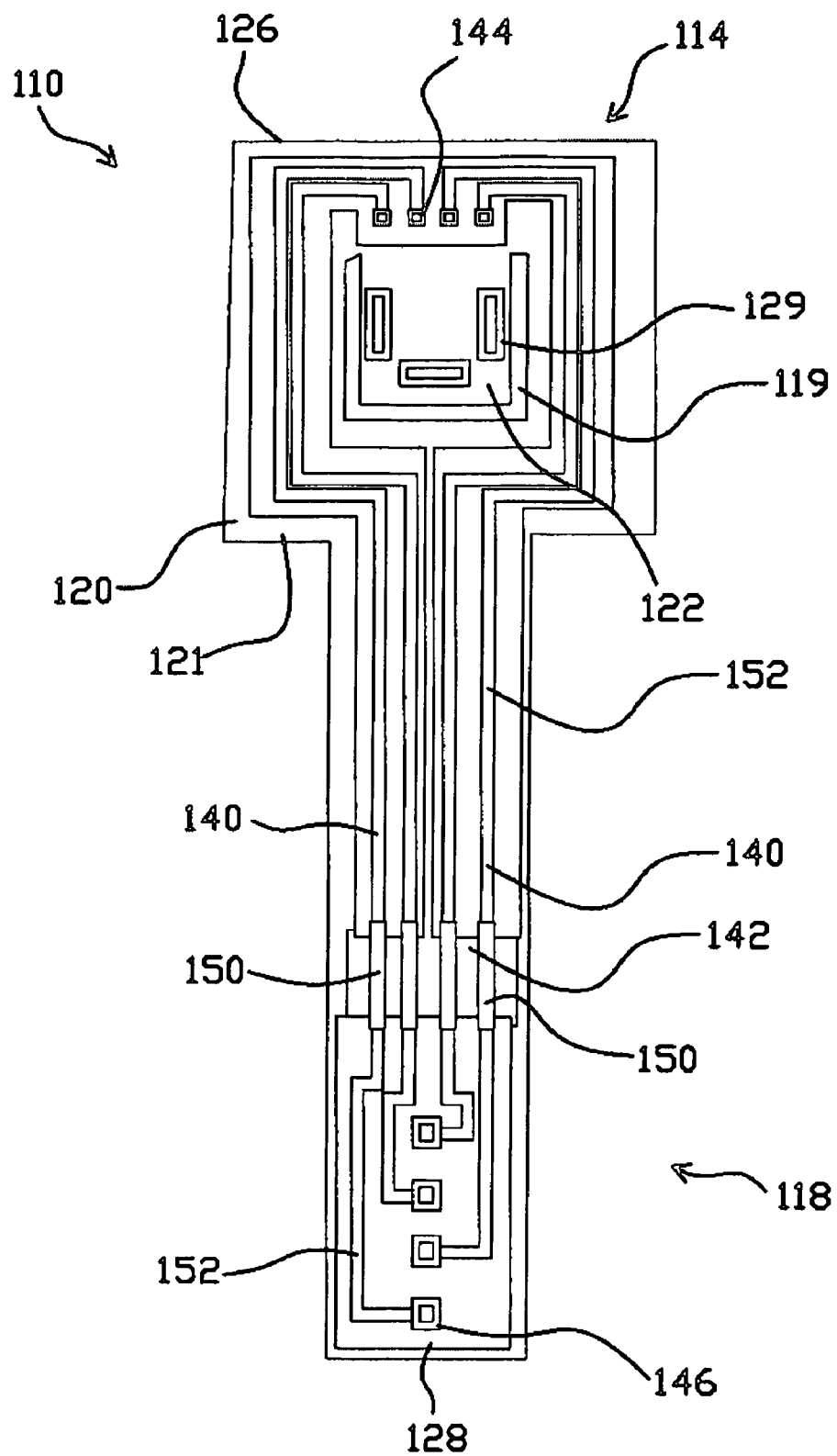
FIG. 5 is a schematic representation of another embodiment of a flexure in accordance with the invention.
Figure 6:
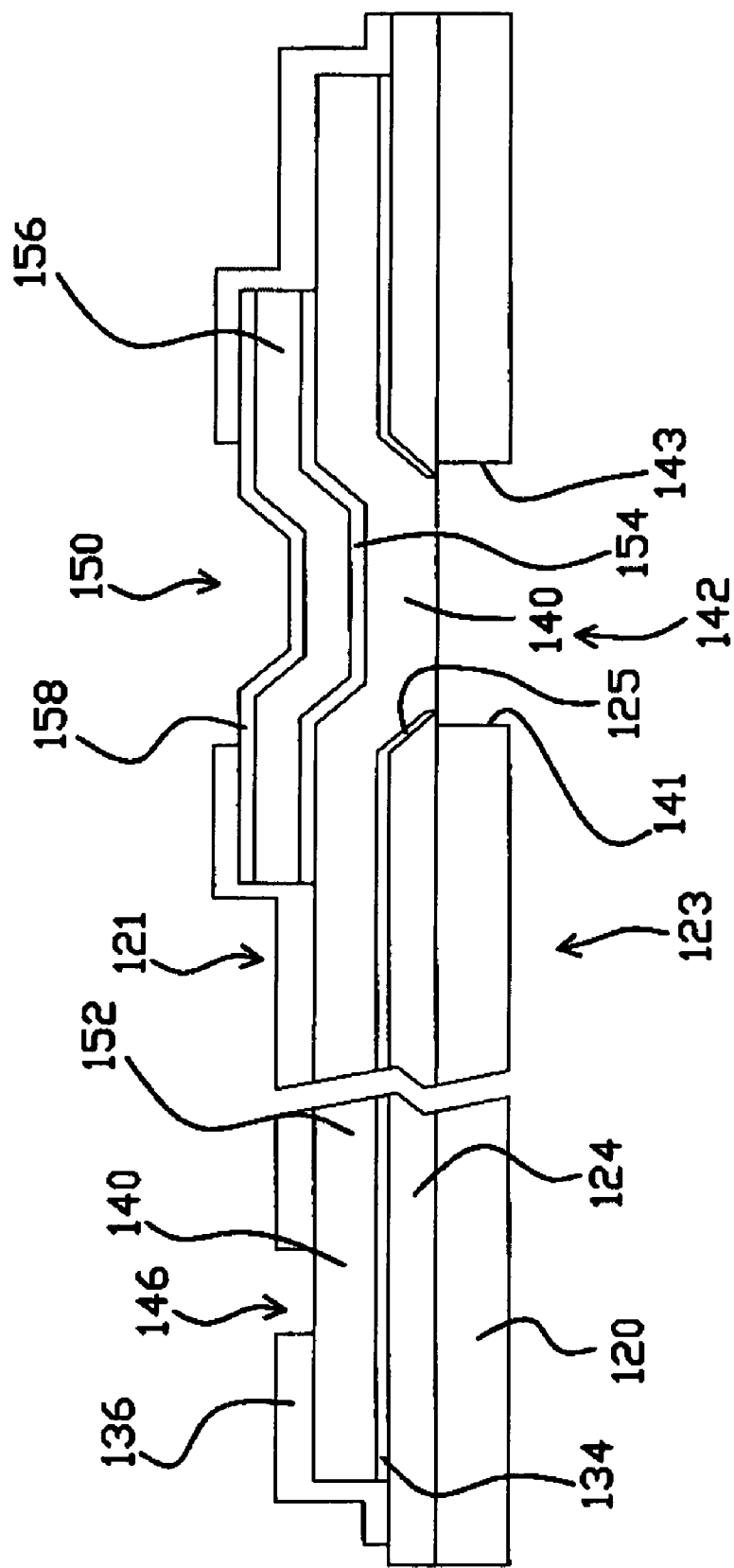
FIG. 6 is a detailed cross-sectional view of a portion of the flexure shown in FIG. 5 showing a multi-layered flying lead region and test pad portion of one of the conductive leads.

Schematic representations of flexure 110 in accordance with another embodiment of the invention are shown in FIGS. 5 and 6. Flexure 110 includes conductive leads 140 that have additional layers of conductive material applied in the flying lead region 150 to strengthen the flying lead region. The strengthened flying lead region 150 of the conductive leads 140 facilitate improved connections between external conductors and the flying lead region of the conductive leads. Conductive leads 140 include a primary conductor portion 152 made of gold that extends across each of the entire conductive leads, similar to the primary conductor portion 52 illustrated in conjunction with flexure 10. In addition, the flying lead region 150 of the illustrated embodiment includes a first flying lead conductive layer 154 of gold applied onto the primary conductor portion 152 in the flying lead region 150. Further, a second flying lead conductive layer 156 applied onto the first flying lead conductive layer 154. Layer 156 is preferably constructed of nickel to provide increased strength to the flying lead region 150. Further still, a third flying lead conductive layer 158 is applied onto the second layer 156. The third layer 158 is preferably formed from gold. Gold outer surfaces on the flying lead region 150 advantageously allow either side to accept ultrasonically welded conductors, gold being the preferred material to ultrasonically weld to in electrical conductor applications. Providing increased strength to the flying lead region 150 allows improved connection between external conductors (not shown) and the flying lead region and facilitates removal of the external conductors for rework without damaging the conductive leads 140 in the flying lead region. With the exception of the flying lead region 150, flexure 110 can be similar to flexure 10 and similar features are identified in the "1XX" series. For example, spring metal layer 120 can be similar or identical to spring metal layer 20.

Figure 7:
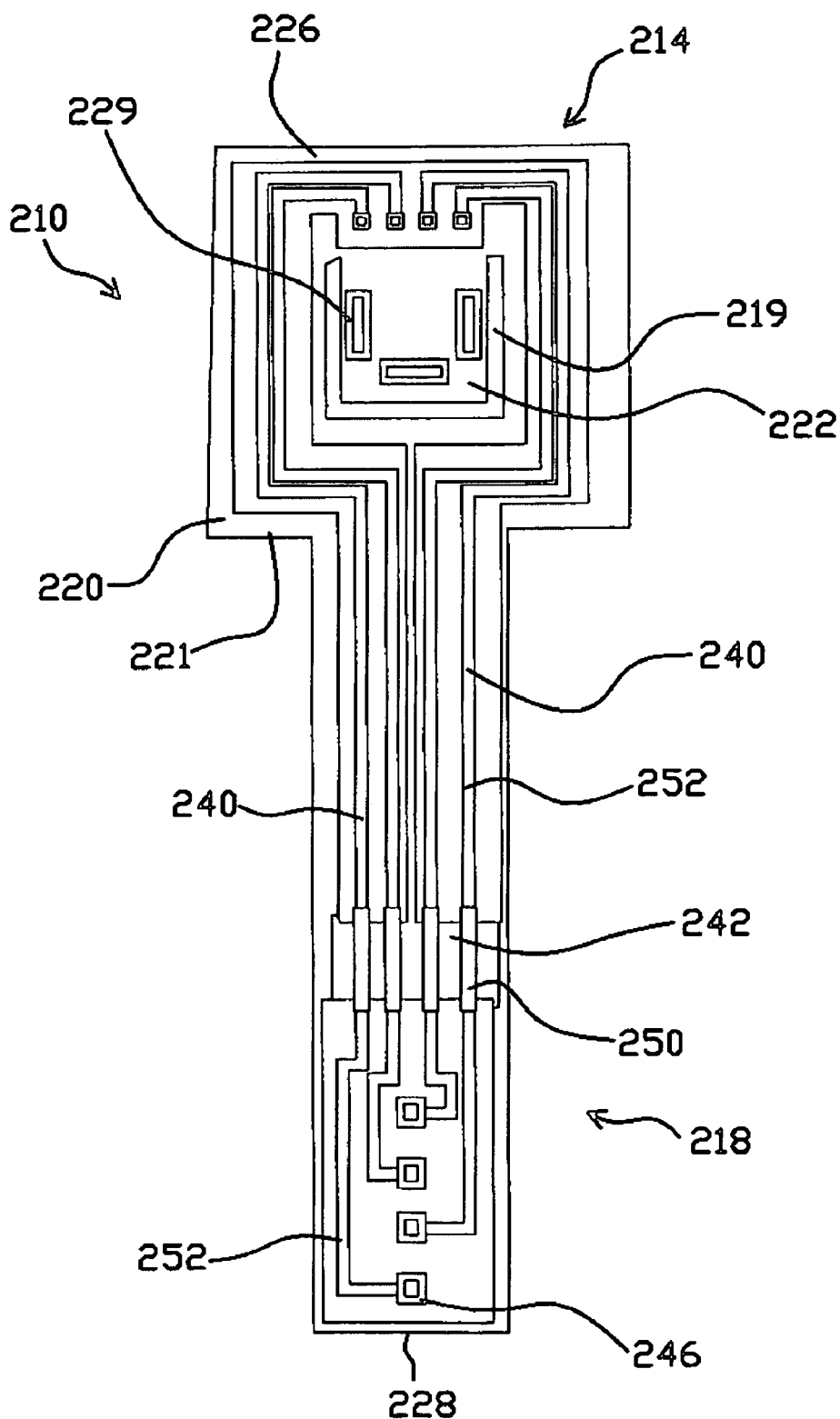
FIG. 7 is a schematic representation of another embodiment of a flexure in accordance with the invention.
Figure 8:
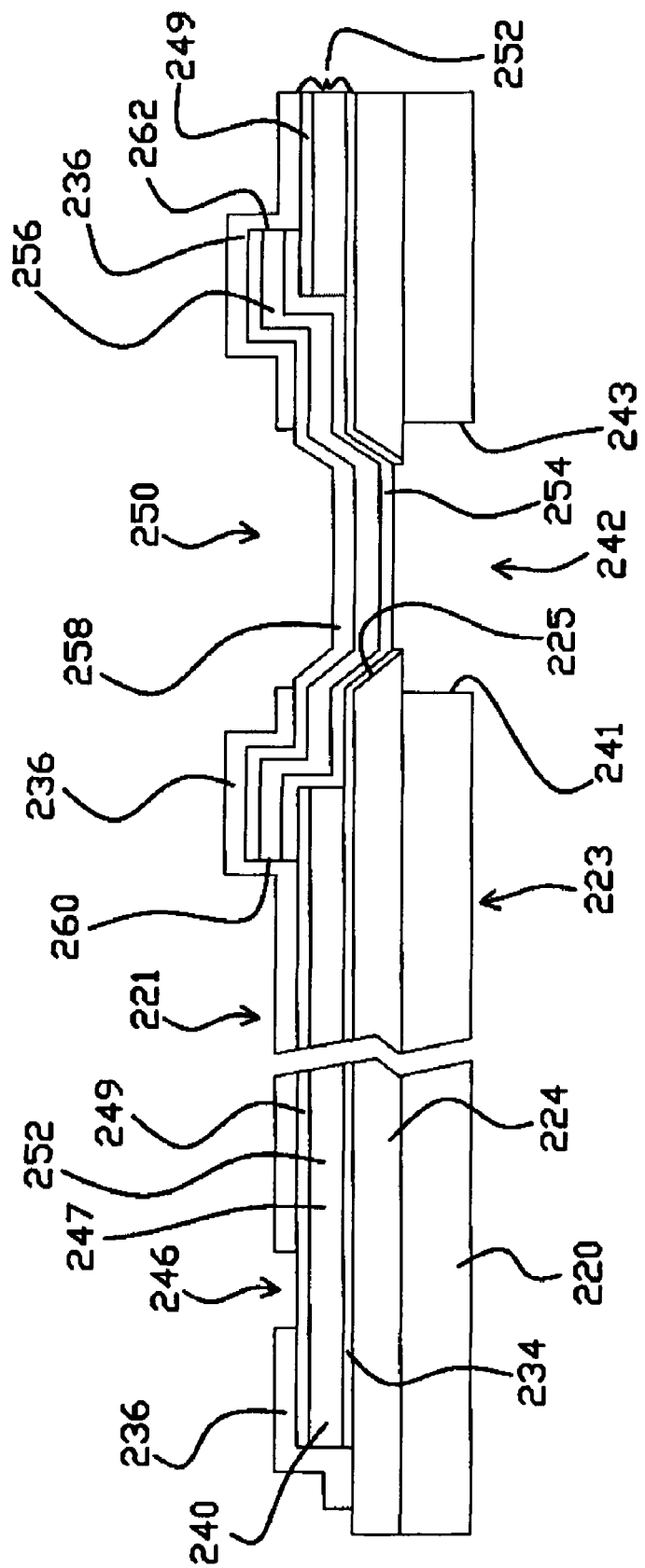
FIG. 8 is a detailed cross-sectional view of a portion of the flexure shown in FIG. 7, showing a multi-layered flying lead region and test pad portion of one of the conductive leads.

Schematic representations of flexure 210 in accordance with yet another embodiment of the invention are shown in FIGS. 7 and 8. Flexure 210 includes a primary conductor portion 252 that has multiple conductive layers formed of different materials. In addition, flying lead region 250 includes multiple layers of materials to strengthen conductors 240, but the primary conductor portions do not extend into the flying lead region. Thus, the flying lead regions can be formed from different materials and applied after the primary conductor portions are applied. The primary conductor portions 252 of conductors 240 have a first conductive layer 247 preferably including silver applied to the seed layer 234 and a second conductive layer 249 preferably including gold applied to the first conductive layer 247. The first conductive layer 247 of silver provides increased conductivity through the primary conductor portions 252 of the conductive lead 240. The second conductive layer 249 of gold provides added corrosion protection for the first layer 247. In addition, the second conductive layer 249 of gold is an acceptable bonding material to which other conductors can be bonded, if necessary. While the first conductive layer 247 is preferably made of silver, it can be made of other materials, including copper, without departing from the scope of the invention.

Figure 9:
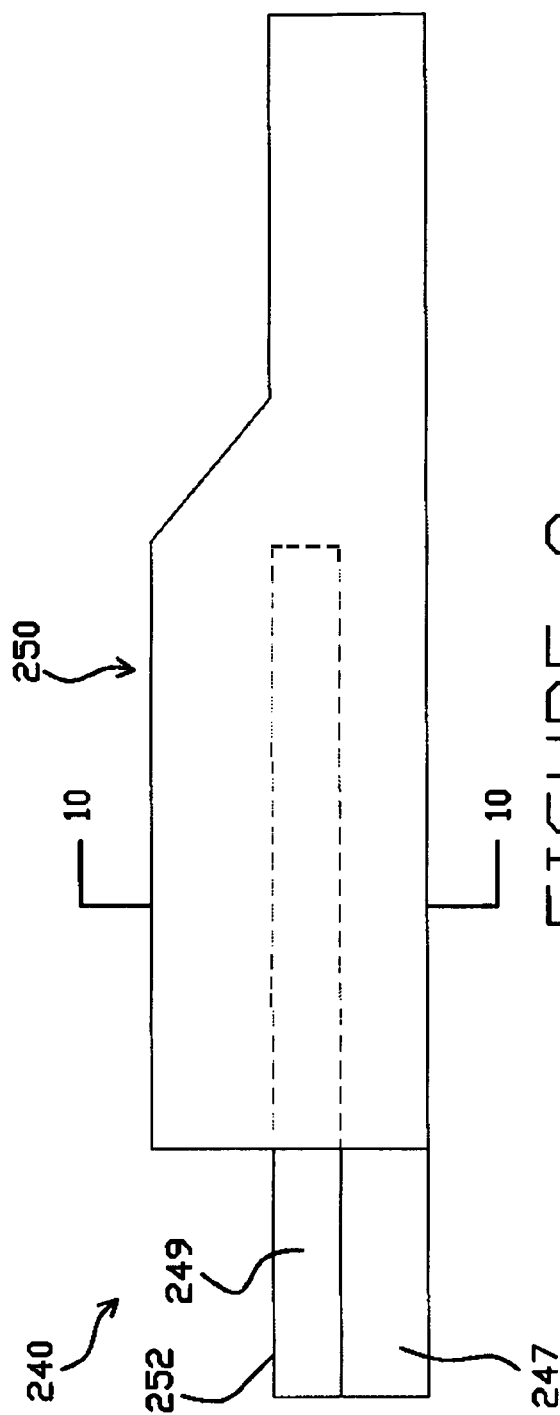
FIG. 9 is a side view of the intersection of a portion of a primary conductor portion and a flying lead region of the flexure shown in FIG. 7.
Figure 10:
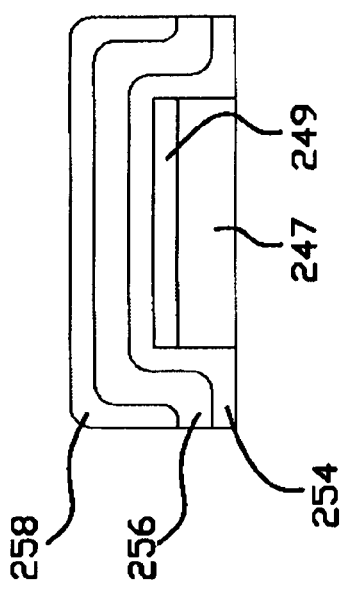
FIG. 10 is a cross-sectional view of the intersection of a portion of a conductive lead of the flexure shown in FIG. 7 taken across the flying lead region.

Conductor 240 in the flying lead region 250 includes a first flying lead conductive layer 254 of gold. The first layer 254 is applied to the flexure from a first end 260, which is applied over a portion of the primary conductor portions 252, and extends down the tapered edge 225 that extends over the aperture 242 from each of the first 241 and second 243 edges of the aperture. The first layer 254 of the flying lead region 250 extends across but not into the aperture 242 formed into the spring metal layer 220. The first layer 254 has a second end 262, which is applied onto the primary conductor portions 252 on an opposing side of aperture 242 from the first end 260. Referring briefly to FIGS. 9-10, at locations where the first layer 254 of the flying lead region 250 is applied to the second layer 249 of the primary conductor portions 252, the first layer 254 is wider than the primary conductor portion to allow for any misregistration that may occur during the additive manufacturing process.

Conductor 240 in the flying lead region 250 also includes a second flying lead conductive layer 256 preferably of nickel and a third flying lead conductive layer 258 of gold. The second layer 256, applied onto the first layer 254, provides added strength to the flying lead region 250. The third layer 258, applied onto the second layer 256 provides a suitable material to which a conductive lead (not shown) can be ultrasonically welded. The second flying lead conductive layer 256 and third flying lead conductive layers 258 are substantially the same width as the first flying lead conductive layer 254 and thus are similarly wider than the primary conductor portion 252 at the first 260 and second 262 ends of the flying lead region. Cover layer 236 can be applied over part of the third flying lead conductive layer 258 of conductive lead 240 including that portion that overlaps the primary conductor portions 252. With the exception of the particular differences discussed above, flexure 210 can be similar to flexure 110 and similar features are identified in the "2XX" series. In particular, the test pad portion 246 is similar or identical to test pad portion 146.

Figure 11:
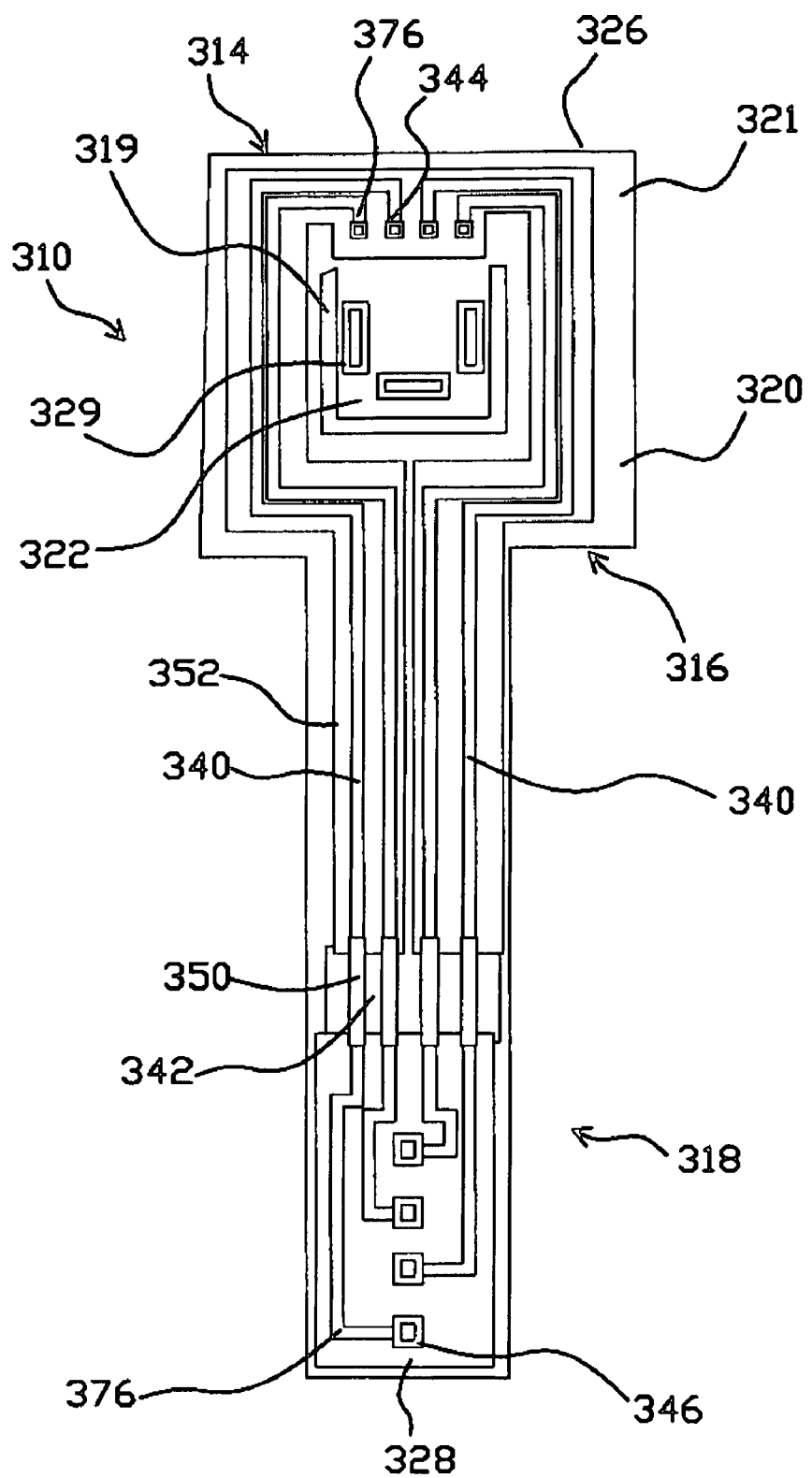
FIG. 11 is a schematic representation of still another embodiment of a flexure in accordance with the invention.
Figure 12:
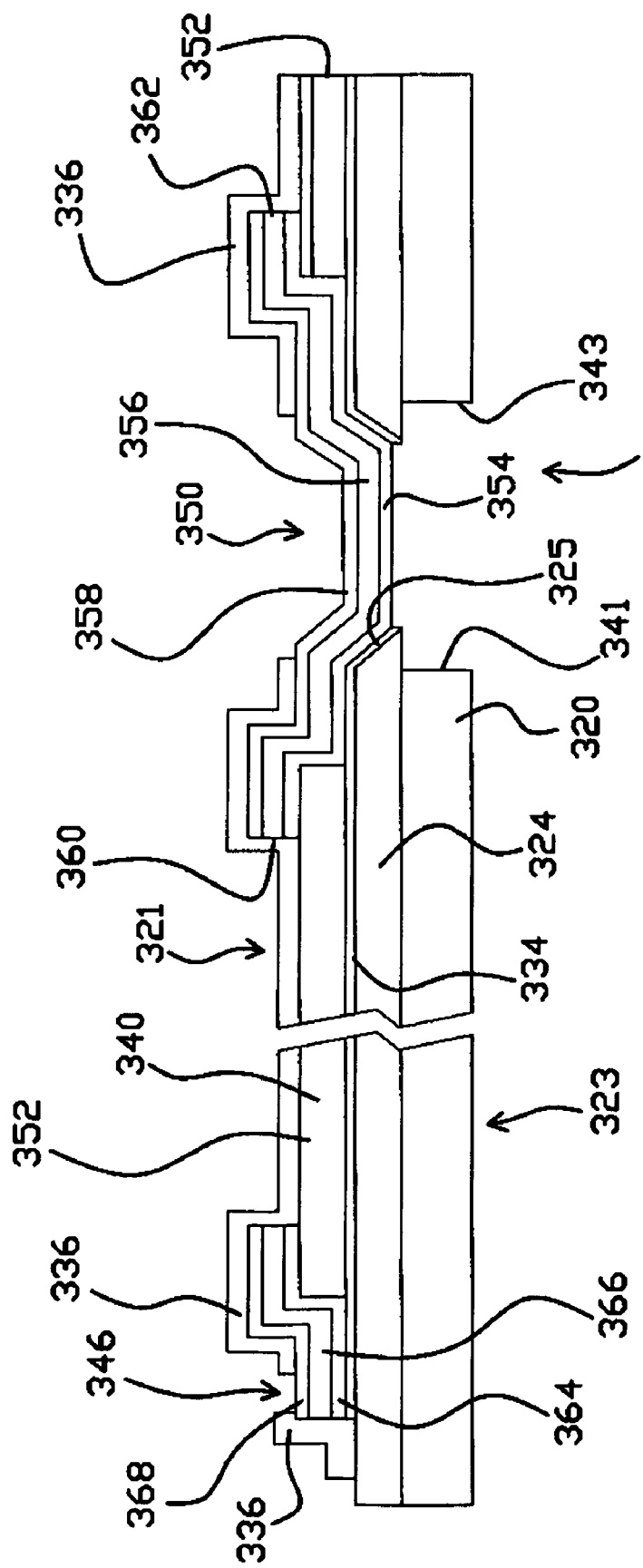
FIG. 12 is a detailed cross-sectional view of a portion of the flexure shown in FIG. 11, showing a conductive lead having a multi-layered flying lead region, access feature, and primary conductor portions.

Schematic representations of flexure 310 in accordance with yet another embodiment of the invention are shown in FIGS. 11 and 12. Like flexure 210, flexure 310 includes a conductor 340 with a flying lead region 350 having multiple layers of material to provide added strength and primary conductor portions 352 that do not extend into the flying lead region. Further, flexure 310 includes test pad portions 346 with multiple conductive layers to provide added strength. Similarly, head bond pad portions 344 can also include multiple conductive layers.

Conductive leads 340 preferably include primary conductor portions 352 formed of silver, which advantageously provides improved conductivity. As with the first conductive layer 247 of primary conductor portion 252 of the embodiment described above, primary conductor portion 352 can be made of copper without departing from the scope of the invention. In addition, conductive leads 340 include a test pad portion 346 having a first test pad conductive layer 364 of gold, a second test pad conductive layer 366 of nickel, and a third test pad conductive layer 368 of gold. Similar to the flying lead region 250 of flexure 210, the test pad portion 346 includes an overlapping interface 376 where the test pad portion 346 is applied over and is wider than a portion of the primary conductor portions 352 that interfaces the test pad portion. Similarly, the cover layer 336 is applied over a portion of the test pad portion 346, so that only a portion of the test pad portion is exposed. Further, a portion of the spring metal layer 320, dielectric layer 324, and seed layer 334 located beneath the test pad portion 346 may be removed to allow for access to the test pad portion from a second major surface 323 of the flexure 310. With the exception of the particular differences in the features described herein, flexure 310 can be substantially similar to flexure 210 and similar features are identified in the "3XX" series.

Figure 13:
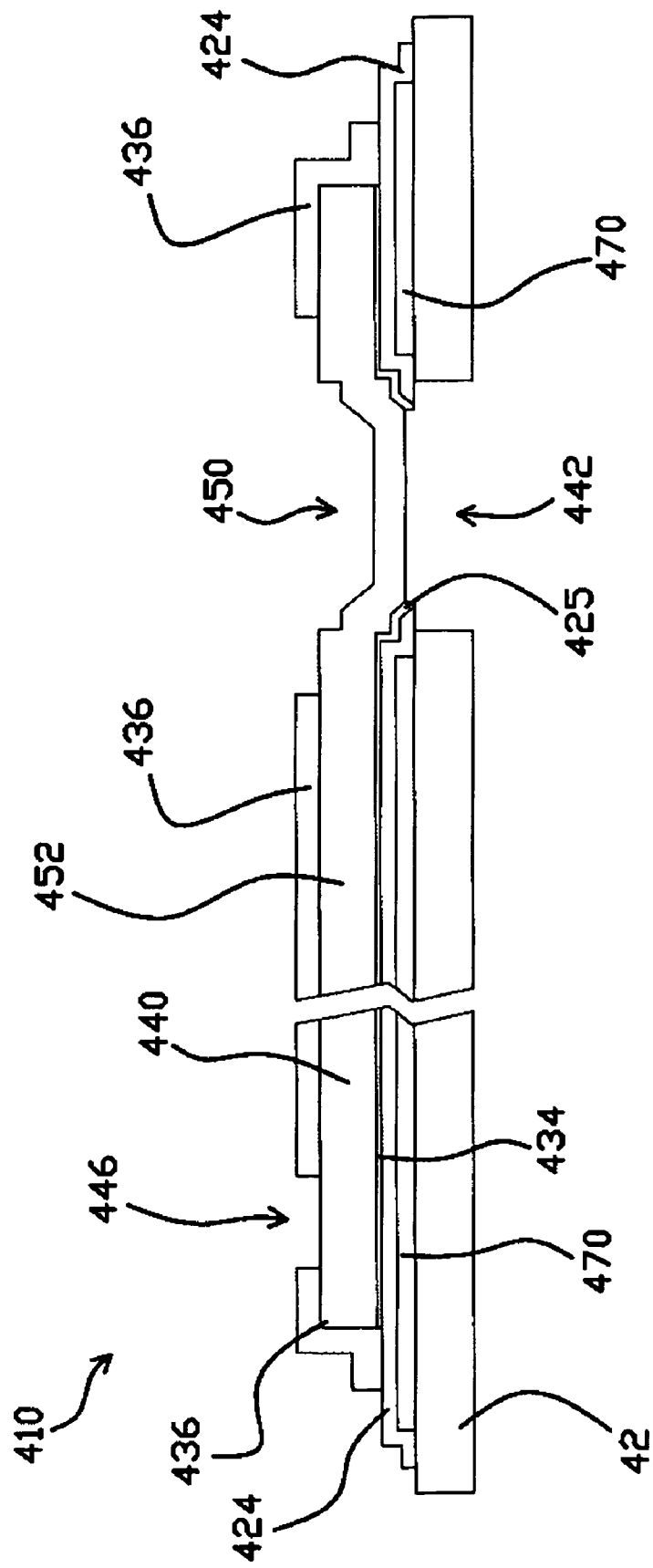
FIG. 13 is a cross-sectional side view of a portion of a flexure according to still another embodiment of the invention having a ground plane positioned beneath a portion of the conductive leads.

In accordance with another embodiment of the invention, FIG. 13 illustrates a side view of a portion of a flexure 410 that includes conductive leads 440 with a ground plane 470 positioned between a dielectric layer 424 and a spring metal layer 420. Ground plane 470 is advantageously positioned between conductive leads 440 and the spring metal layer 420 and can be selectively applied along any portion of the spring metal layer 420. The ground plane 470 is effectively encased between the dielectric layer 424 and the spring metal layer 420, so that it does not require any additional protection. The ground plane 470 is formed from conductive material, and is preferably formed from silver, but can also be formed from copper, nickel, aluminum, gold or alloys of these materials. In an alternative embodiment (not shown), a portion of a conductive lead 440 may be directly positioned adjacent to the ground plane 470 without any intervening dielectric material. In this alternative embodiment, the conductive lead that is in contact with the ground plane is thus grounded to the spring metal layer through the ground plane. The thickness of ground plane 470 can vary over the spring metal layer 420. With the exception of the inclusion of a ground plane 470, flexure 410 can be similar to, or substantially the same as, flexure 10 and similar features are identified in the "4XX" series. The ground plane feature described in this embodiment can be included with any other embodiment without departing from the scope of the invention.

Figure 14:
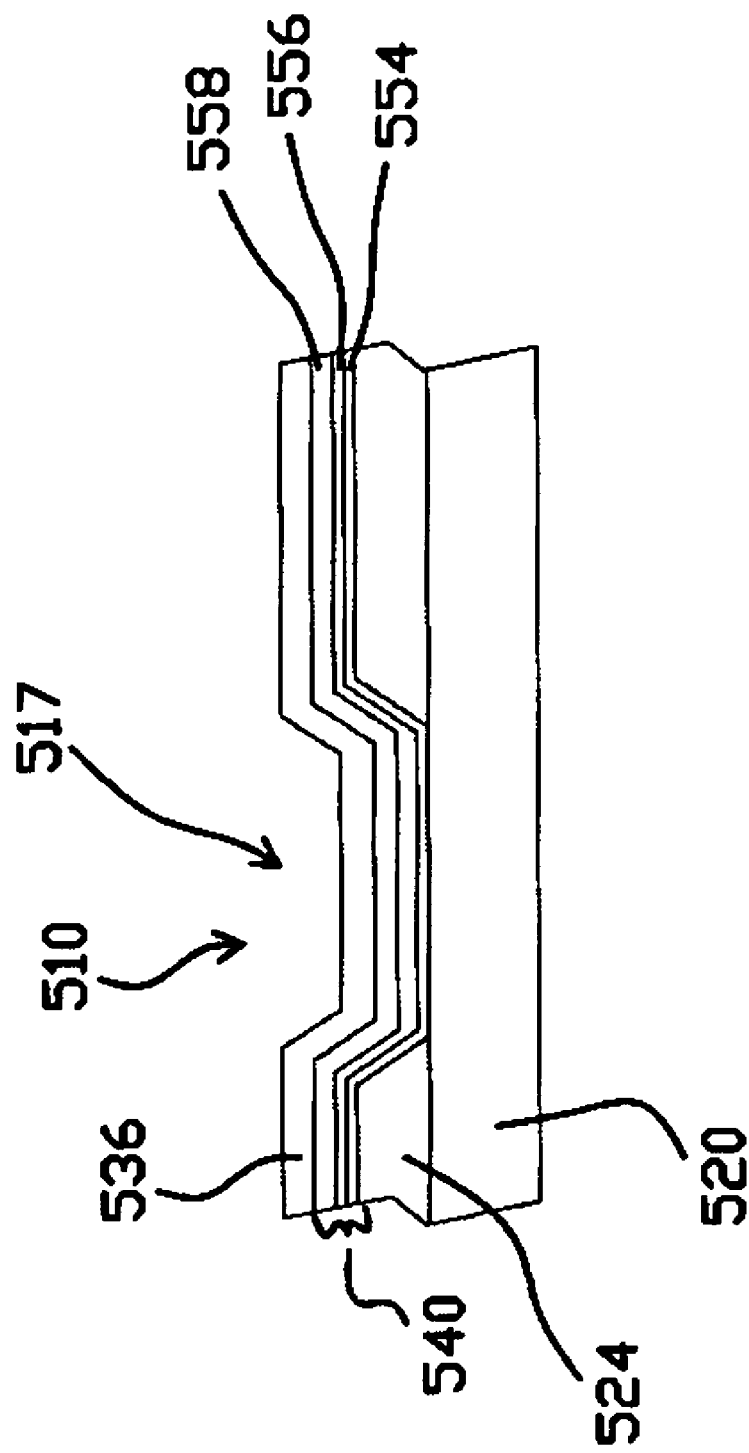
FIG. 14 is a detailed cross-sectional view of a portion of a flexure according to another embodiment of the invention showing a conductive lead grounded to a spring metal layer.

FIG. 14 is a side view of a portion of flexure 510 in accordance with yet another embodiment of the invention. Flexure 510 includes a conductive lead 540 that is in electrical communication with spring metal layer 520. Conductive lead 540 is shown with a first conductive layer 554 preferably of gold. At least a portion of the first conductive layer 554 of conductive lead 540 is applied to and in electrical communication with spring metal layer 520 along a gap 517 in a dielectric layer 524. Other portions of the first conductive layer 554 of conductive lead 540 may be positioned applied to the dielectric layer 524 over portions of the flexure 510. The conductive lead 540 in the illustrated embodiment includes a second conductive layer 556 made of nickel applied onto the first conductive layer 554. In addition, the conductive lead 540 includes a third conductive layer 558 made of gold and applied onto the second conductive layer 556. The grounding feature shown in this embodiment can be combined with other embodiments described above without departing from the scope of the invention.

The previously described embodiments are described for illustrative purposes. The conductive leads described above in these previous embodiments can include variations from those described without departing from the scope of the invention. For example, the flying lead region, primary conductor portion, test pad portion and head bond pad portion of any of the above embodiments may be matched together to form new embodiments of the current invention, without departing from the scope thereof. In addition, other arrangements of materials may be used within each of the portions outlined above. As one example, the primary conductor portions of a conductive lead may include copper or nickel. In addition, although the conductive leads of the embodiments described above are adapted to provide electrical communication between an external conductor and a magnetic head mounted on the flexure, other conductive leads may be adapted to provide electrical communication in other circuits without departing from the scope of the invention.

As has been described above in conjunction with flexures 110, 210, and 310, the flying lead region can include multiple layers of differing materials such as nickel to create strong conductive leads in the flying lead region. Alternatively, the flying lead region of the conductive leads can be reinforced with other structures to provide additional strength. FIGS. 15A-C illustrate a portion of flexure 10a having conductive leads 40a with an attached reinforcement member 82a in a flying lead region 50a in accordance with another embodiment of the invention. FIG. 15A illustrates a cross-sectional view of flexure 10a taken through a longitudinal axis of one conductive lead 40a in the flying lead region 50a. The dielectric layer 24a extends further over the aperture 42a of spring metal 20a than previously discussed embodiments. The conductive leads 40a are applied along the dielectric layer 24a on each of a first edge 41a and second edge 43a of the aperture 42a uncovered by cover layer 36a.

The reinforcement member 82a includes an island of spring metal 72a that is attached to each of the conductive leads 40a in the flying lead region 50a and is approximately the same width as the conductive lead 40a to which it is attached. While the isolated spring metal portions 72a may be planar with the spring metal layer 20a of flexure 10a, they are not physically integral to the spring metal layer. The island of spring metals 72a extend toward, and are attached to, a portion of the dielectric layer 24a on each end of the island of spring metal 72a.

A first conductive reinforcing layer 84a of conductive material is applied to and surrounds the portion of each the conductive leads 40a not covered by cover 36a. In addition, the first reinforcing layer 84a is applied to and surrounds the island of spring metal 72a. In one embodiment, the first reinforcing layer 84a includes nickel to provide additional strength to the conductive lead 40a. Each conductive lead 40a also includes a second reinforcing layer 86a that is applied to and surrounds the first reinforcing layer 84a. In one embodiment, the second reinforcing layer 86a includes gold. As is shown in FIG. 15C, the dielectric layer 24a is positioned in between a portion of the conductive lead 40a and island of spring metal 72a and also separates the first conductive layer 84a and second layer 86a on each end of the reinforcement member 82a. With the exception of the reinforcement added to the conductive lead 40a in the flying lead region 50a, flexure 10a is similar to or substantially identical to flexure 10 and similar features are identified in the "XXa" series.

FIGS. 16A-C show flexure 10b having conductive leads 40b with an attached reinforcement member 82b in a flying lead region 50b in accordance with another embodiment of the invention. FIG. 16A illustrates a cross-sectional view of a flexure 10b taken through a longitudinal axis of one conductive lead 40b in the flying lead region 50b showing a reinforcement member 82b having isolated spring metal portions 72b and 73b that provide reinforcement for each conductive lead. Conductive leads 40b are applied along the dielectric layer 24b on each of a first edge 41b and second edge 43b of the aperture 42b uncovered by cover layer 36b.

The reinforcement member 82b includes an island of spring metal 72b that is attached to each of the conductive leads 40b in the flying lead region 50b and is approximately the same width as the conductive lead 40b to which it is attached. While the isolated spring metal portions 72b may be planar with the spring metal layer 20b of flexure 10b, they are not physically integral to the spring metal layer. The island of spring metal 72b extends toward, and is attached to, a portion of the dielectric layer 24b on each end of the island of spring metal 72b.

A first conductive reinforcing layer 84b of conductive material is applied to and surrounds the portion of each the conductive leads 40b not covered by cover 36b. In addition, the first reinforcing layer 84b is applied to and surrounds the island of spring metal 72b. In one embodiment, the first reinforcing layer 84b includes nickel to provide additional strength to the conductive lead 40b.

Each conductive lead 40b also includes a second reinforcing layer 86b that is applied to and surrounds the first reinforcing layer 84b. In the illustrated embodiment, the second reinforcing layer 86b includes gold. As is shown in FIG. 16C, the dielectric layer 24b is positioned in between a portion of the conductive lead 40b and island of spring metal 72b and also separates the first conductive layer 84b and second layer 86b on each end of the reinforcement member 82b.

Additionally, the dielectric layer 24b has apertures 88b formed through it on each side of the dielectric layer 24b that extends over the aperture 42b. An island of spring metal 73b is attached to the conductive layer underneath each of the apertures 88b. Conductive lead 40b extends into each of the apertures 88b and is electrically and mechanically connected to the island of spring metal 73b to anchor the conductive lead 40b through the conductive layer 24b to the island of spring metal, thereby providing additional strength to the flying lead region 50b. With the exception of the reinforcement member added to the conductive lead 40b in the flying lead region 50b, flexure 10b is similar to or substantially identical to flexure 10 and similar features are identified in the "XXb" series.

The reinforcement members described above in conjunction with FIGS. 15A-C and 16A-C include an island of spring metal attached to a conductive lead on a flexure similar to flexure 10. While flexure 10 includes conductive leads 40 preferably made of gold, alternatively, all or parts of the conductive leads 40a and 40b, including portions in the flying lead region 50a and 50b may be made of other materials such as copper. The island of spring metal provides strength to the flying lead region, but also protects the conductive leads from etching processes that might otherwise compromise the integrity of a conductive lead made of materials such as copper during the manufacturing process as described below.

Figure 17A:
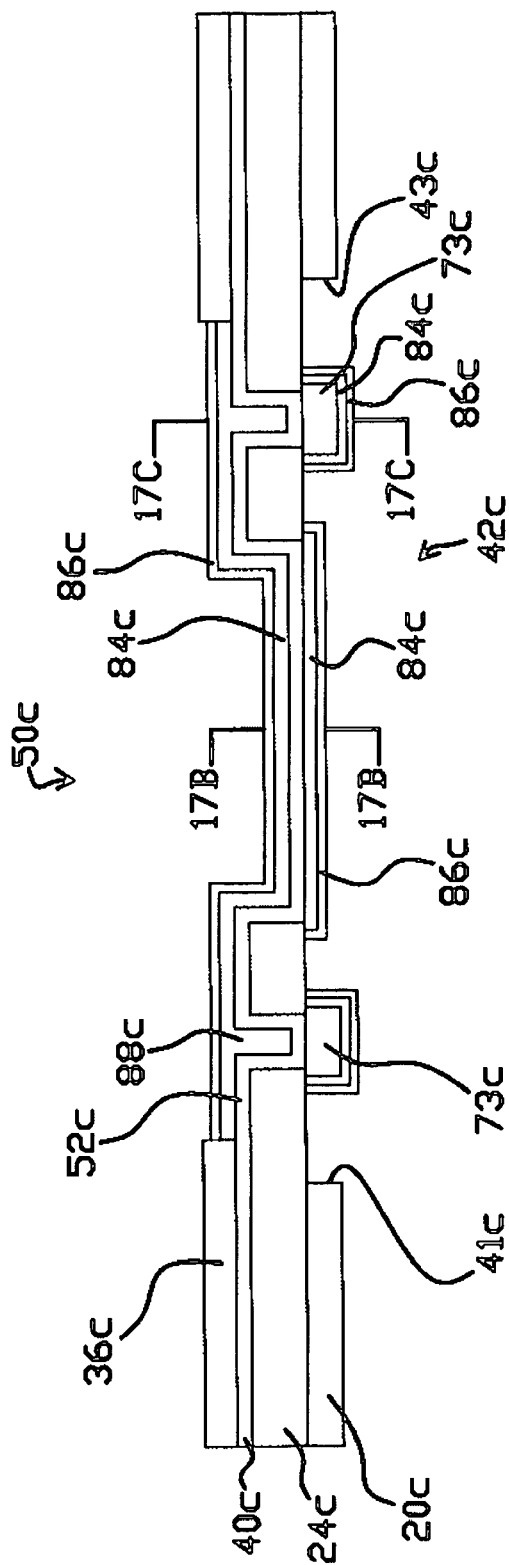
FIGS. 17A-C are cross-sectional side views of still another alternative embodiment of the flexure shown in FIGS. 3 and 4 having a flying lead region with an alternative reinforcement member.
Figure 17C:
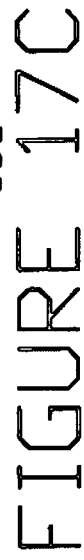
Figure 17B:
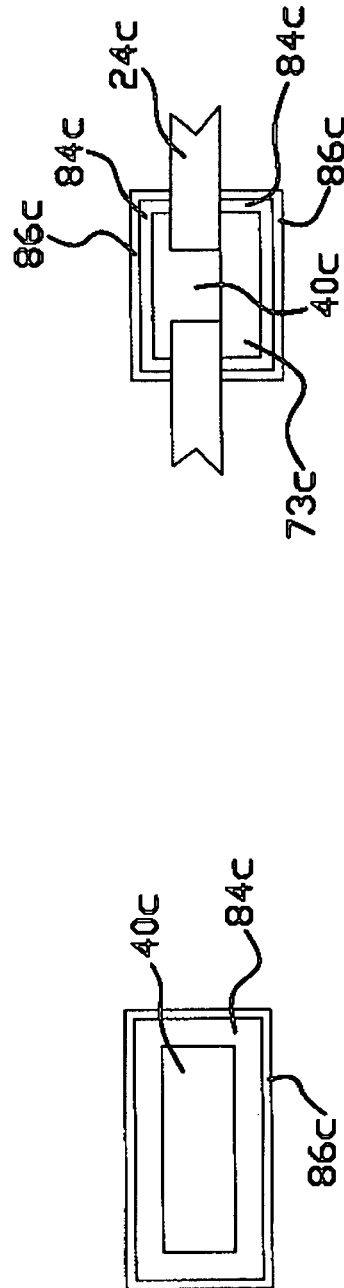

FIGS. 17A-C show still another alternative embodiment of a flexure 10c having conductive leads 40c with an attached reinforcement member 82c in a flying lead region 50c. FIG. 17A illustrates a cross-sectional view of a flexure 10c taken through a longitudinal axis of one conductive lead 40c in the flying lead region 50c showing a reinforcement member 82c having isolated spring metal portions 73c and layers of conductive reinforcing material that provide reinforcement for each conductive lead.

A first conductive reinforcing layer 84c of conductive material is applied to and surrounds the portion of each the conductive leads 40c not covered by cover 36c. In one embodiment, the first reinforcing layer 84c includes nickel to provide additional strength to the conductive lead 40c. Each conductive lead 40c also includes a second reinforcing layer 86c that is applied to and surrounds the first reinforcing layer 84c. In the illustrated embodiment, the second reinforcing layer 86c includes gold. As is shown in FIG. 17C, the dielectric layer 24c separates part of the first conductive layer 84b and second layer 86c near each end of the reinforcement member 82c.

Additionally, the dielectric layer 24c has apertures 88c formed through it on each side of the dielectric layer 24c that extends over the aperture 42c. An island of spring metal 73c is attached to the conductive layer underneath each of the apertures 88c. Conductive lead 40c extends into each of the apertures 88c and is electrically and mechanically connected to the island of spring metal 73c to anchor the conductive lead 40c through the conductive layer 24c to the island of spring metal, thereby providing additional strength to the flying lead region 50c. With the exception of the reinforcement added to the conductive lead 40c in the flying lead region, flexure 10c is similar to or substantially identical to flexure 10 and similar features are identified in the "XXc" series.

Figure 18A:
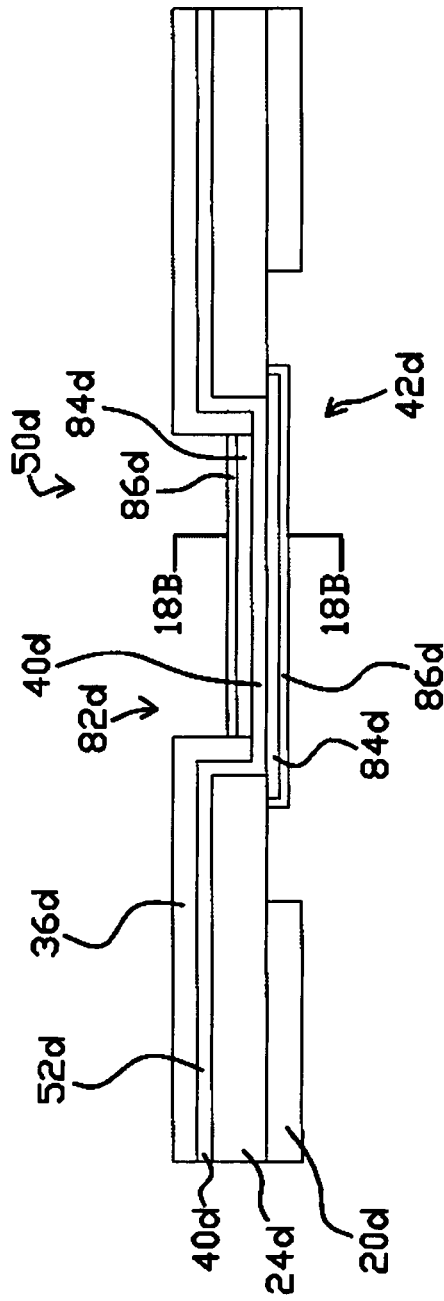
FIGS. 18A and B are cross-sectional side views of still another alternative embodiment of the flexure shown in FIGS. 3 and 4 having a flying lead region with an alternative reinforcement member.
Figure 18B:
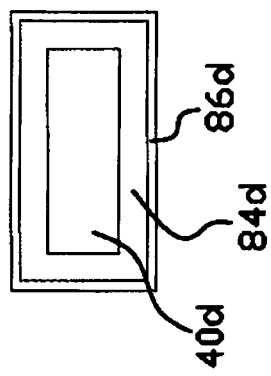

FIGS. 18A and B show still another alternative embodiment of a flexure 10d having conductive leads 40d with an attached reinforcement member 82d in a flying lead region 50d. FIG. 18A illustrates a cross-sectional view of a flexure 10d taken through a longitudinal axis of one conductive lead 40d in the flying lead region 50d showing a reinforcement member 82d having layers of conductive reinforcing material that provide reinforcement for each conductive lead. Flexure 10d has a spring metal layer 20d having an aperture 42d. A portion of the dielectric layer 24d extends over a proximal edge 41d and a distal edge 43d of aperture 42d in spring metal layer 20d. Cover layer 36d extends beyond the edges of the dielectric layer 24d to cover a portion of the conductive leads 40a that extend over the aperture 42d.

A first conductive reinforcing layer 84d of conductive material is applied to and surrounds the portion of each the conductive leads 40d not covered by cover 36d. In one embodiment, the first reinforcing layer 84d includes nickel to provide additional strength to the conductive lead 40d. Each conductive lead 40d also includes a second reinforcing layer 86d that is applied to and surrounds the first reinforcing layer 84d. In the illustrated embodiment, the second reinforcing layer 86d includes gold. With the exception of the reinforcement added to the conductive lead 40d in the flying lead region, flexure 10d is similar to or substantially identical to flexure 10 and similar features are identified in the "XXd" series.

FIGS. 19A-C show still another alternative embodiment of a flexure 10e having conductive leads 40e with an attached reinforcement member 82e in a flying lead region 50e including layers of reinforcing conductive material and formations in a cover 36e to relieve stress that may be induced in the conductive leads 40e in the flying lead region 50e. FIG. 19A illustrates a cross-sectional view of a flexure 10e taken through a longitudinal axis of one conductive lead 40e in the flying lead region 50e showing a reinforcement member 82e having layers of conductive reinforcing material that provide reinforcement for each conductive lead. Flexure 10e has a spring metal layer 20e having an aperture 42e over which conductive leads 40e extend. Dielectric layer 24e extends over a proximal edge 41e and a distal edge 43e of aperture 42e in the spring metal layer 20e. Part of the conductive leads 40e that are applied to the dielectric layer 24e extend out from, and are not covered by, the cover layer 36e on each side of each of the flying lead region 50e.

A first conductive reinforcing layer 84e of conductive material is applied to and surrounds the portion of each the conductive leads 40e in the flying lead region 50e not covered by cover 36e. In one embodiment, the first reinforcing layer 84e includes nickel to provide additional strength to the conductive lead 40e. Each conductive lead 40e also includes a second reinforcing layer 86e that is applied to and surrounds the first reinforcing layer 84e. In the illustrated embodiment, the second reinforcing layer 86e includes gold Additionally, as is shown in FIG. 19C, which is a view taken from the first major surface 21e of the flexure 10e, cover layer 36e includes notches 98e formed into the cover layer 36e on each side of the aperture 42e into which the first 84e and second 86e layers of material extend. The notches 98e absorb stress from the reinforcement member 82e through the first 84e and second 86e layers. With the exception of the differences described here with respect to reinforcement member 82e, flexure 10c is substantially similar to flexure 10 and similar features are identified in the "XXe" series.

Figure 21A:
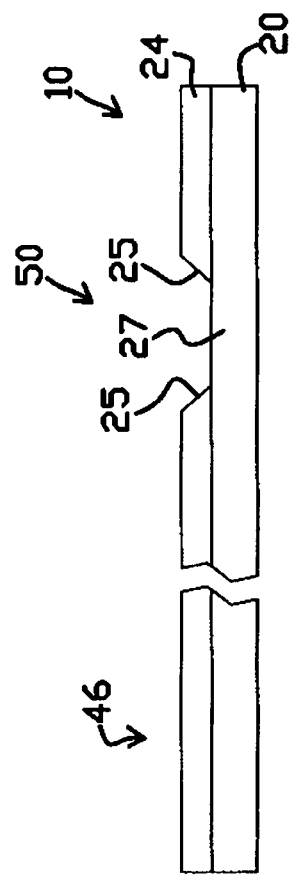

The embodiments above describe conductive leads on a flexure that are resistant to corrosion, have a strong flying lead region, and allow for access to the conductive leads through the flexure in one or more locations. FIG. 20 outlines the steps in a flowchart for one embodiment of an additive process 610 for manufacturing conductive leads 40 onto spring metal layer 20 of flexure 10 as shown in FIG. 3. FIGS. 21A-L illustrate flexure 10 after sequential steps of the additive process of FIG. 20. FIG. 21A illustrates flexure 10 after the step 612 of applying a photosensitive polyimide material to form a dielectric layer 24 onto the spring metal layer 20. A photolithography process can be used to apply and pattern the polyimide material on the spring metal layer 20. While the dielectric layer 24 can extend over a large portion of spring metal layer 20, the dielectric layer is patterned to have a gap over a portion 27 of the spring metal layer 20 where aperture 42 (as shown in FIG. 3) will eventually be formed. The thickness of the dielectric layer 24 decreases near the portion 27, so as to form a tapered edge 25 on the dielectric layer. While the dielectric layer 24 may be applied to most of the rest of the spring metal layer 20, it need only be applied to areas where it is desirable to isolate the spring metal layer 20 from the conductive leads 40 that will be formed on the flexure 10.

Figure 21B:
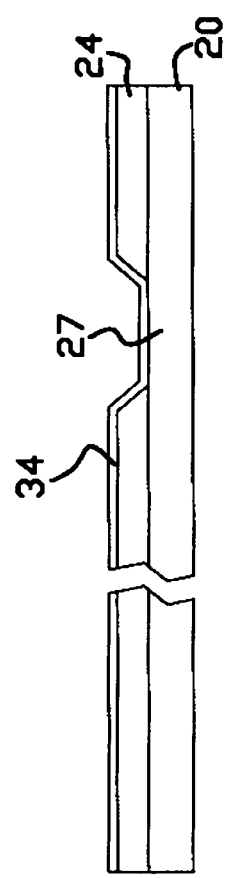

FIG. 21B illustrates flexure 10 after a subsequent step 614 of applying a seed layer 34 onto the flexure 10. The seed layer 34 can be applied to the flexure 10 by employing a vacuum deposition process or other known processes to sputter seed layer material onto the surface of the flexure. The seed layer 34 will be used as an electrical reference during a subsequent plating process. It should be noted that while the dielectric layer 24 is not applied onto the portion 27, the seed layer 34 is applied onto portion 27.

Figure 21C:
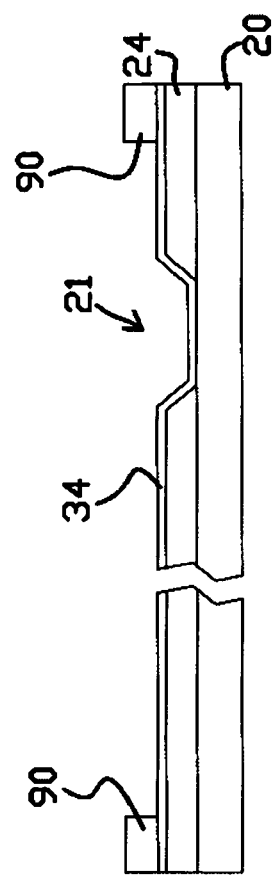
Figure 21D:
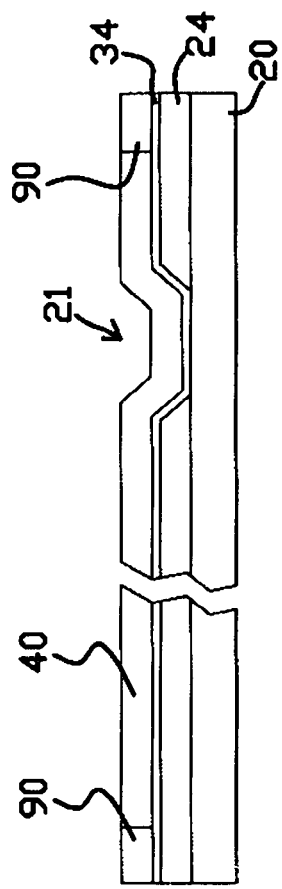
Figure 24:
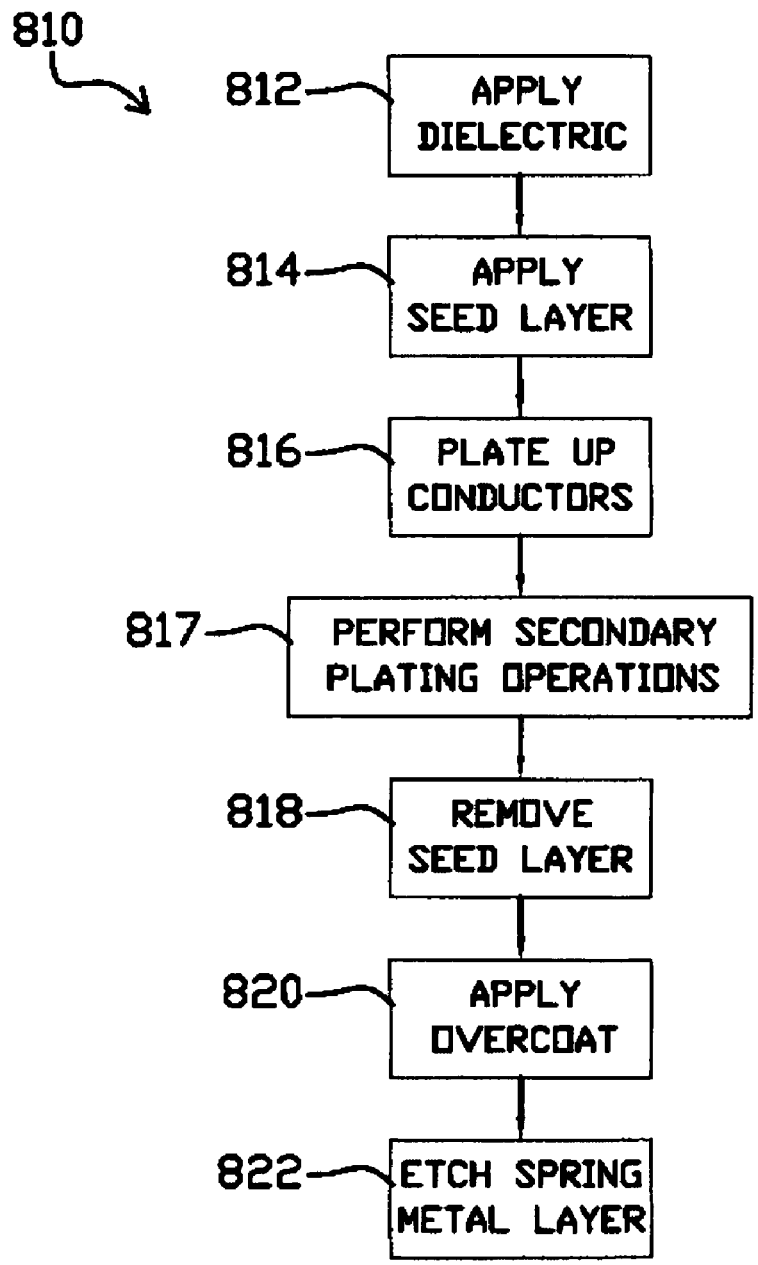
FIG. 24 is a flow chart outlining the steps of manufacturing conductive leads onto the flexure shown in FIGS. 5 and 6 in accordance with another embodiment of the invention.

Referring to FIGS. 21C-E, a subsequent step is the step 616 of plating conductive leads 40 onto the flexure 10. Prior to plating the conductive leads 40, a mask of resist material 90 is applied and patterned onto the first major surface 21 using a photolithography process to define where it is and is not desired to have conductive leads 40 added to the flexure 10. Once the mask of resist material 90 has been applied and patterned, the gold conductive leads 40 are plated to the flexure 10 along the first major surface 21 in areas where there is no resist material 90. Conventional electroplating or electroless plating processes can be used for this purpose. After the conductive leads 40 have been plated onto the flexure 10, the resist material 90 is removed from the flexure 10.

FIG. 21F illustrates a subsequent step 618 of removing that portion of the seed layer 34 from the flexure 10 that is not covered by conductive leads 40. The seed layer 34 can be removed by a chemical etching process or other known processes, leaving conductive leads 40 and dielectric layer 24 covering the first major surface 21. Referring to FIG. 21G, a subsequent step is the step 620 of applying cover layer 36 onto flexure 10. The cover layer 36 is applied primarily over portions of the conductive leads 40 and surrounding areas of the first major surface 21, leaving some or all of the flying lead region 50, test pad portions 46 and head bond pad portion (not shown) free from coverage by the cover layer. The cover layer 36 is preferably a photosensitive polyimide similar or identical to the material used for the dielectric layer 24 and is applied with a similar photolithography process.

FIG. 21H illustrates the results of a subsequent step 622 of etching spring metal layer 20 and seed layer 34 away from a portion of a second major surface 23 of the flexure 10 to create an aperture 42 that allows access to the conductive leads 40 from the second major surface. Photolithography, ferric chloride-based etching, or other known processes can be used to perform step 622. Additional spring layer removal may alternatively be performed to create apertures (not shown) to allow access from the second major surface 23 for the test pad portion 46 and/or the head bond pad portion (not shown).

FIGS. 21I-L illustrate the step 622 of etching spring metal layer 20 and seed layer 34 away from a portion of a second major surface 23 of the flexure 10. FIG. 21I is a cross section of flexure 10 taken through the flying lead region 50 of FIG. 21G, that is, prior to the creation of aperture 42. Four conductive leads 40 are shown positioned above the seed layer 34, all of which is positioned over spring metal layer 20. In FIG. 21J, a mask of resist material 92 is applied and patterned onto the first major surface 21 and second major surface 23 using a photolithography process. The mask defines a portion of the second major surface 23 where it is desirable to create aperture 42. The resist material 92 is resistant to the etchant used to create the aperture 42 in the spring metal layer 20 and preferably applied and patterned using a photolithography process.

Once the resist material 92 has been applied and patterned, the flexure 10 is exposed to an etchant (not shown) to form the aperture 42 as is shown in FIG. 21K. The etchant will, in one embodiment also remove the seed layer 34 that is applied to the conductive leads 40 that extend over the newly created aperture 42. Because the etchant does not react with gold, the conductive leads 40 leads are not affected by the etching process. While the conductive leads 40 that extend over the aperture 42 are made exclusively of gold, in other embodiments, such as flexure 110 as shown in FIG. 6, conductive layers of the flying lead region are made of materials other than gold. In these other embodiments, it is important that gold layers adjacent to the spring metal, such as a combination of the primary conductor portion 152 and first flying lead conductive layer 154 of flexure 110, be thick enough to prevent wicking between the conductive lead and resist material so as to protect other layers. While gold is resistant to the etching, other materials, such as nickel or copper, are susceptible to the etchant used during the process of creating an aperture 142 into the spring metal layer 120 and must be protected or they will be etched. Referring to FIG. 21L, after the etching process the resist material 92 is removed, leaving a flying lead region 50 with conductors 40 that extend over the aperture 42 formed into the spring metal layer 20.

While step 622 of etching the spring metal layer 20 of flexure 10 is described above as creating aperture 42 through the spring metal layer 20, it should be understood that by applying the resist material 92 using other patterns, the aperture formed may be different from the aperture 40 of flexure 10. For example, the apertures 42a, 42b, and 42c of flexures 10a, 10b and 10c, respectively, as shown in FIGS. 15A, 16A, and 17A, may be etched to define islands of spring metal 72a, 72b, 73b, 73c, and other similar configurations.

FIGS. 22 and 23A-K illustrate steps in another embodiment of an additive process 710 for manufacturing the conductive leads 140 onto the spring metal layer 120 of flexure 110 shown in FIGS. 5 and 6. One step, illustrated in FIG. 23A, is the step 712 of applying a photosensitive polyimide material to form a dielectric layer 124 onto the spring metal layer 120. A photolithography process used to apply and pattern the polyimide material. While the dielectric layer 124 can extend over a large portion of spring metal layer 120, the dielectric layer is patterned to have a gap over a portion 127 of the spring metal layer 120 where aperture 142 (as shown in FIG. 5) will eventually be formed. The thickness of the dielectric layer 124 typically decreases near the portion 127, so as to form a tapered edge 125 on the dielectric layer. While the dielectric layer 124 may be applied to most of the rest of the spring metal layer 120, it need only be applied to areas where it is desirable to isolate the spring metal layer 120 from the conductive leads 140 that will be formed on the flexure 110.

A subsequent step, illustrated in FIG. 23B, is a step 714 of applying a seed layer 134 onto the flexure 110. The seed layer 134 can be applied to the flexure 110 by employing a vacuum deposition process or other known processes to sputter seed layer material onto the surface of the flexure. The seed layer 134 will be used as an electrical reference during a subsequent plating process. It should be noted that while the dielectric layer 124 is not applied over the portion 127, the seed layer 134 is applied onto portion 127.

Another subsequent step, illustrated in FIGS. 23C-E, is a step 716 of plating primary conductor portion 152 of conductive leads 140 onto the seed layer 134 of flexure 110. Prior to plating the primary conductor portion 152, a mask of resist material 190 is applied and patterned onto the first major surface 121 using a photolithography process to define where it is and is not desired to have primary conductor portion 152 added to the flexure 110.

Once the resist material 190 has been applied and patterned, the gold primary conductor portions 152 of the conductive leads 140 are plated to the flexure 110 along the first major surface 121 in areas where there is no resist material 190. As in the previously described embodiment, electroplating processes can be used to plate the primary conductor portions 152. After the primary conductor portions 152 have been plated onto the flexure 110, the resist material 190 is removed from the flexure 110.

Still another subsequent step, illustrated in FIGS. 23F-H, is the step 717 of performing secondary plating operations on the flying lead region 150. Prior to the performing the secondary plating operation, portions of the first major surface 121 of flexure 110 are covered with a mask of resist material 190 to cover those parts of the flexure not intended to receive plating in a secondary plating operation. Once the mask of resist material 190 has been applied, the secondary plating operation is performed on the conductive leads 140 in the flying lead region 150 using electroplating or electroless plating processes. In one embodiment, a first flying lead conductive layer 154 of gold is plated onto the flexure 110 as part of the secondary process. In a subsequent plating operation, a second flying lead conductive layer 156 of nickel is applied onto the first layer 154. In yet another subsequent plating operation, a third flying lead conductive layer 158 of gold is applied to the second layer 156. While the first flying lead conductive layer 154, the second flying lead conductive layer 156, and the third flying lead conductive layer 158 are described as being gold, nickel, and gold, respectively, other materials or combinations of materials may be used to form the flying lead region, including silver, copper, various alloys, including gold alloys. Portions of conductive leads 140 in flying lead region 150 that are accessible along major surfaces 121 and 123 of flexure 110, however, are preferably formed of gold. After the secondary plating operations are completed, the resist material 190 is removed from the flexure 110, using processes described above leaving the flexure as shown in FIG. 23H.

FIG. 23I illustrates a subsequent step 718 of removing that portion of the seed layer 134 from the flexure 110 that is not covered by conductive leads 140. The seed layer 150 is removed with an etching or other known process, leaving conductive leads 140 and dielectric layer 124 covering the first major surface 121.

Referring to FIG. 23J, a subsequent step is the step 720 of applying cover layer 136 onto flexure 110. The cover layer 136 is applied primarily over primary conductor portions 152 of the conductive leads 140 and surrounding areas of the first major surface 121, leaving the flying lead region 150, test pad portion 146, and head bond pad portion (not shown) free from coverage by the cover layer. Part of the primary conductor portions 152 may also be uncovered by the cover layer 136 without departing from the scope of the invention. The cover layer 136 is applied as described above in conjunction with step 620 of method 610.

FIG. 23K illustrates the results of a subsequent step 722 of etching spring metal layer 120 and seed layer 134 away from a portion of a second major surface 123 of the flexure 110. Step 722 creates an aperture 142 that allows access to the flying lead region 150 of the conductive leads 140 from the second major surface 123. Additional etching may alternatively be performed to create apertures (not shown) to allow access from the second major surface 123 for the test pad portion 146, the head bond pad portion (not shown), or both. The etching and photolithography processes of the type identified above can be used to form aperture 142. It should be noted that the thickness of the first flying lead conductive layer 154 is important to prevent etchant from compromising the integrity of the second flying lead conductive layer 156, which may not be resistant the etchant.

Figures 25G, 25H, 25I, 25J, 25K:
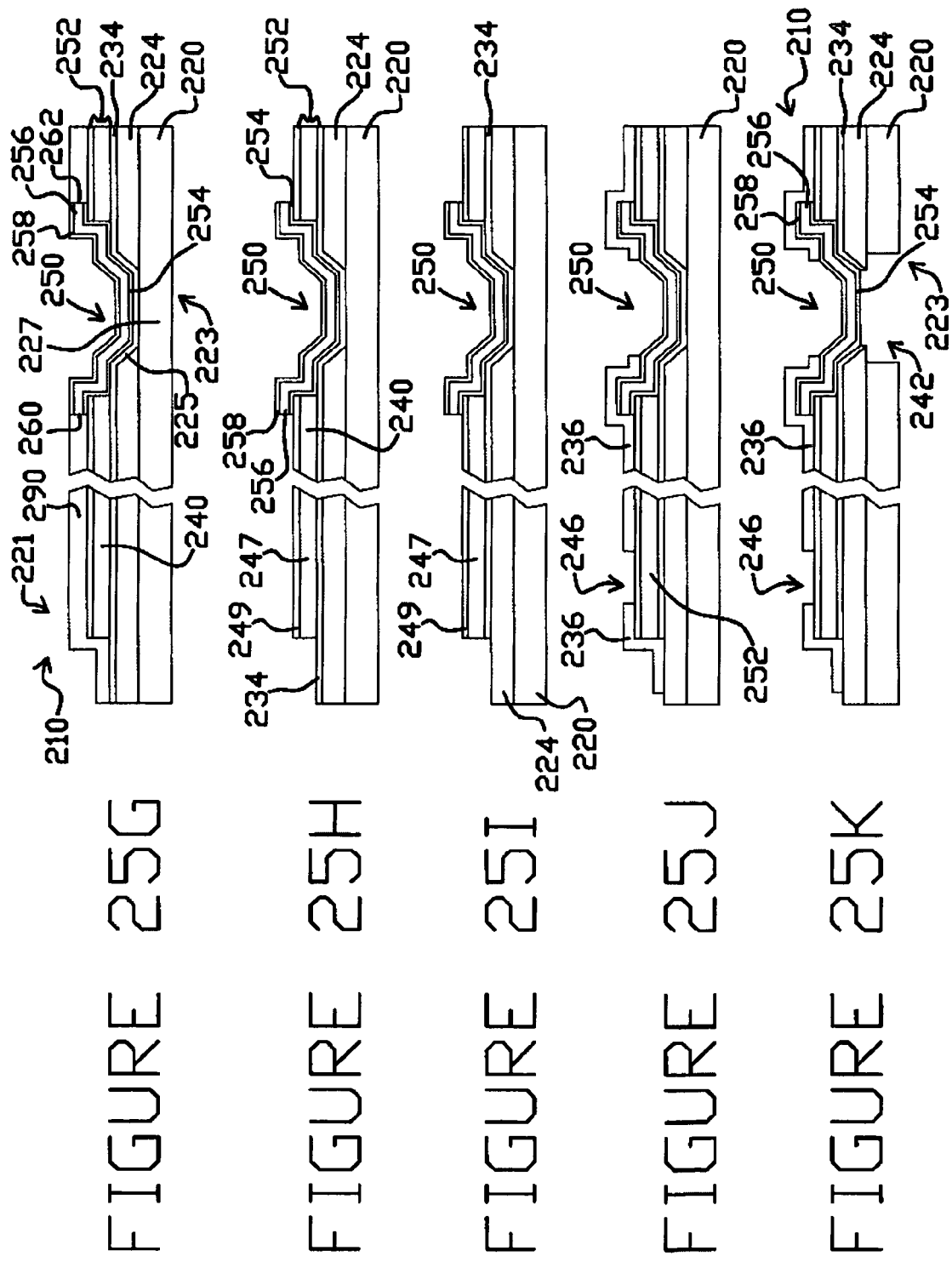
Figure 26:
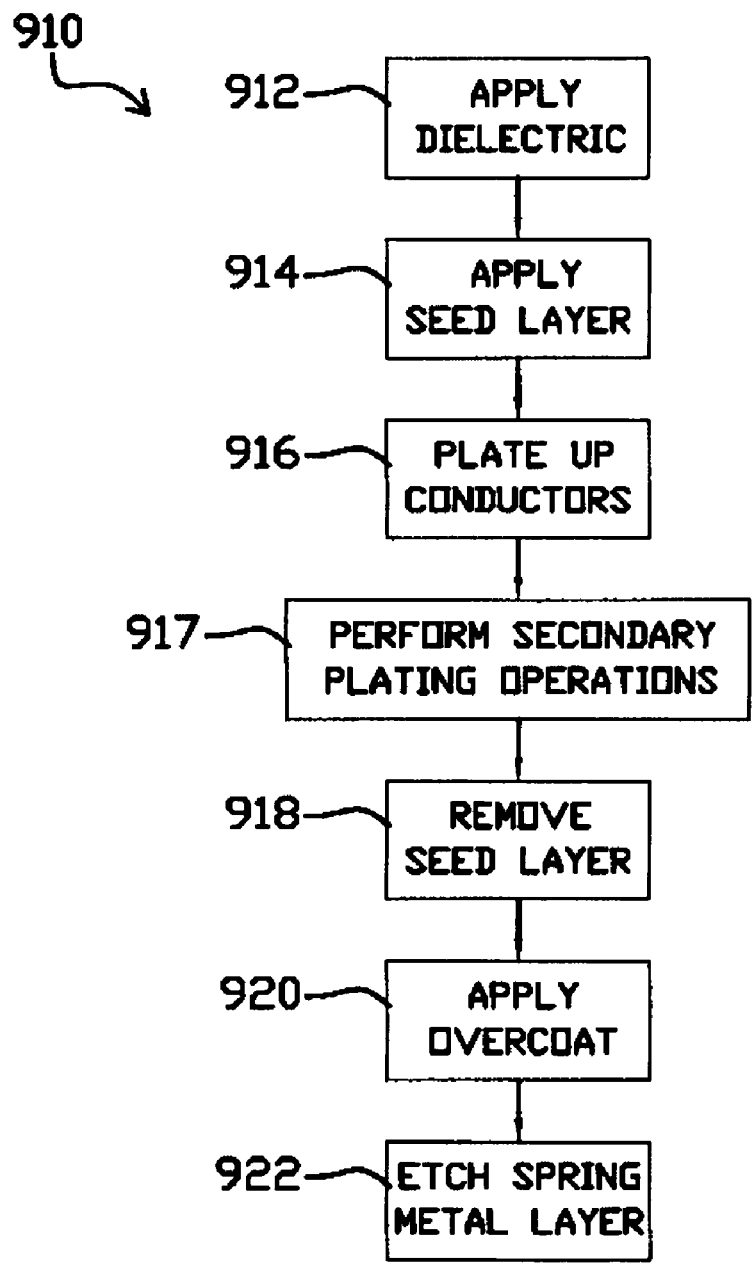
FIG. 26 is a flow chart outlining the steps of manufacturing conductive leads onto the flexure shown in FIGS. 5 and 6 in accordance with another embodiment of the invention.

FIGS. 24 and 25A-K illustrate steps in another embodiment of an additive process 810 for manufacturing conductive leads 240 onto the flexure 210 as is shown in FIGS. 7 and 8 above. One step, illustrated in FIG. 25A, is the step 812 of applying a photosensitive polyimide material to form a dielectric layer 224 onto the spring metal layer 220. Conventional photolithography processes are used to apply and pattern the polyimide material and includes applying the polyimide material. The thickness of the dielectric layer 224 decreases near the portion 227, so as to form a tapered edge 225 on the dielectric layer. While the dielectric layer 224 may be applied to most of the rest of the spring metal layer 220, it need only be applied to areas where it is desirable to isolate the spring metal layer 220 from the conductive leads 240 that will be formed on the flexure 210.

A subsequent step, illustrated in FIG. 25B, is a step 814 of applying a seed layer 234 onto the flexure 210. The seed layer 234 can be applied to the flexure 210 by employing a vacuum deposition or otherwise known process to sputter seed layer material onto the surface of the flexure. The seed layer 234 will be used as an electrical reference during a subsequent plating process. It should be noted that while the dielectric layer 224 is not applied over the portion 227, the seed layer 234 is applied onto portion 227.

FIGS. 25C-E show a step 816 of plating primary conductor portions 252 of conductive leads 240 onto the seed layer 234 of flexure 210. Prior to plating the primary conductor portions 252, resist material 290 is applied using methods described above to portions of a first major surface 221 to create a mask of protected portions and exposed portions. Protected portions overlay areas to be protected from subsequent deposition of conductive materials during subsequent plating processes. Exposed portions overlay areas for subsequent deposition of conductive materials. It should be noted that the resist material is applied into areas where flying lead regions have been plated in previous embodiments thereby preventing the primary conductor portions 252 from extending into the flying lead region 250.

Once the resist material 290 has been applied, primary conductor portions 252 of the conductive leads 240 are plated onto the major surface 221. The primary conductor portions 252, in this embodiment, include a first conductive layer 247, preferably made of silver although other materials including copper may be used, applied to the seed layer 234. After the first conductive layer 247 is plated, a second plating operation is performed to plate a second conductive layer 249 of gold onto the first layer 247. After the plating operations are completed, the resist material 290 is removed from the first major surface 221 of the flexure 210 as is shown in FIG. 25E, leaving the primary conductor portions 252 of the conductive leads 240.

Still another subsequent step, illustrated in FIGS. 25F-H, is the step 817 of performing secondary plating operations on the conductive leads 240. Prior to the performing the secondary plating operations, a mask of resist material 290 is applied to the first major surface 221 of flexure 210 using a photolithography process to define what portions of the major surface will be exposed for subsequent plating operations.

Once the resist material 290 has been applied, the secondary plating operation is performed on the conductive leads 240 in the flying lead region 250 using plating processes of the type identified above. In one embodiment, a first flying lead conductive layer 254 of gold is plated along a path between a first end 260 and a second end 262. The first flying lead conductive layer 254 is plated onto a portion of the second layer 249 of the primary conductor portion 252 that is not covered by the resist material 290, a portion of the dielectric layer 224 extending out from the primary conductor portion 252, down a tapered edge 225, and across a portion 227 of the spring metal layer 220. In a subsequent plating operation, a second flying lead conductive layer 256 of nickel is applied onto the first flying lead conductive layer 254. In yet another subsequent plating process, a third flying lead conductive layer 258 of gold is applied to the second flying lead conductive layer 256. It should be noted that the flying lead conductive layers 254, 256, and 258 overlap the primary conductor portions 252 to allow for misregistration during the secondary plating process as is diagrammed in FIGS. 9 and 10.

While the first flying lead conductive layer 254, second flying lead conductive layer 256, and third flying lead conductive layers 258 added in the secondary plating operations are described as being gold, nickel, and gold, respectively, other materials or combinations of materials can be used to form the conductive leads 240 in the flying lead region, including silver, copper, and various alloys. Portions of conductive leads 240 in flying lead region 250 that are accessible along major surfaces 221 and 223 of flexure 210, however, are preferably formed of gold to advantageously provide a desired surface to which conductors (not shown) can be ultrasonically welded. After the secondary plating operations are completed, the resist material 290 is removed from the flexure 210, using processes described above.

FIG. 25I illustrates a subsequent step 818 of removing that portion of the seed layer 234 from the flexure 210 that is not covered by completed conductive leads 240. The seed layer 250 is removed by etching or other known processes, leaving conductive leads 240 and dielectric layer 224 covering the first major surface 221.

Referring to FIG. 25J, a subsequent step is the step 820 of applying cover layer 236 onto flexure 210. The cover layer 236 is applied primarily over primary conductor portions 252 of the conductive leads 240 and surrounding areas of the first major surface 221, leaving part of the conductive leads 240 in the flying lead region 250, the test pad portion 246, and the head bond pad portion (not shown) free from coverage by the cover layer. Part of the primary conductor portions 252 may also be uncovered by the cover layer 236 without departing from the scope of the invention. The cover layer 236 is applied as described above in conjunction with step 620 of method 610.

FIG. 25K illustrates the results of a subsequent step 822 of etching spring metal layer 220 and seed layer 234 from a portion of a second major surface 223 of the flexure 210. Step 822 creates an aperture 242 that allows access to the flying lead region 250 from the second major surface 223. Additional etching may alternatively be performed to create apertures (not shown) to allow access from the second major surface 223 for the test pad portion 246 and the head bond pad portion (not shown). Aperture 242 can be formed by photolithography and etching processes similar to those identified above with respect to FIGS. 21I-L. It should be noted that the first flying lead conductive layer 254 should be thick enough to prevent etching material from wicking up to, and compromising the integrity of, the second flying lead conductive layer 256, which may not be resistant the etchant.

FIGS. 26 and 27A-K illustrate steps in another embodiment of an additive process 910 for manufacturing conductive leads 340 onto the flexure 310 as is shown in FIGS. 11 and 12 above. One step, illustrated in FIG. 25A, is the step 912 of using a photolithography process of the type described above to form a dielectric layer 324 onto a portion the spring metal layer 320. The thickness of the dielectric layer 324 decreases near a portion 327 of the spring metal layer 320 where no dielectric layer 324 is applied, so as to form a tapered edge 325 on the dielectric layer. While the dielectric layer 324 may be applied to most of the rest of the spring metal layer 320, it need only be applied to areas where it is desirable to isolate the spring metal layer 320 from the conductive leads 340 that will be formed on the flexure 310.

A subsequent step, illustrated in FIG. 27B, is a step 914 of applying a seed layer 334 onto the flexure 310. The seed layer 334 can be applied to the flexure 310 by employing a vacuum deposition process or other known processes to sputter seed layer material onto the surface of the flexure. The seed layer 334 will be used as an electrical reference during a subsequent plating process. It should be noted that while the dielectric layer 324 is not applied onto the portion 327, the seed layer 334 is applied onto portion 327.

FIGS. 27C-E show a step 916 of plating primary conductor portions 352 of conductive leads 340 onto the seed layer 334 of flexure 310. Prior to plating the primary conductor portions 352, a resist material 390 is applied using methods of the type described above to portions of a first major surface 321 to create a mask of protected portions and exposed portions. Protected portions overlay areas to be protected from subsequent deposition of conductive materials during subsequent plating processes. Exposed portions overlay areas for subsequent deposition of conductive materials. It should be noted that the resist material is applied into areas where flying lead regions have been plated in previous embodiments thereby preventing the primary conductor portions 352 from extending into the flying lead region 350.

Once the resist material 390 has been applied, primary conductor portions 352 of the conductive leads 340, which are preferably made of silver but can also be made of other materials, including copper, are plated onto the major surface 321. After the plating operations are completed, the resist material 390 is removed from the first major surface 321 of the flexure 310 as is shown in FIG. 27E, leaving the primary conductor portions 352 of the conductive leads 340.

Figures 27G, 27H, 27I, 27J, 27K:
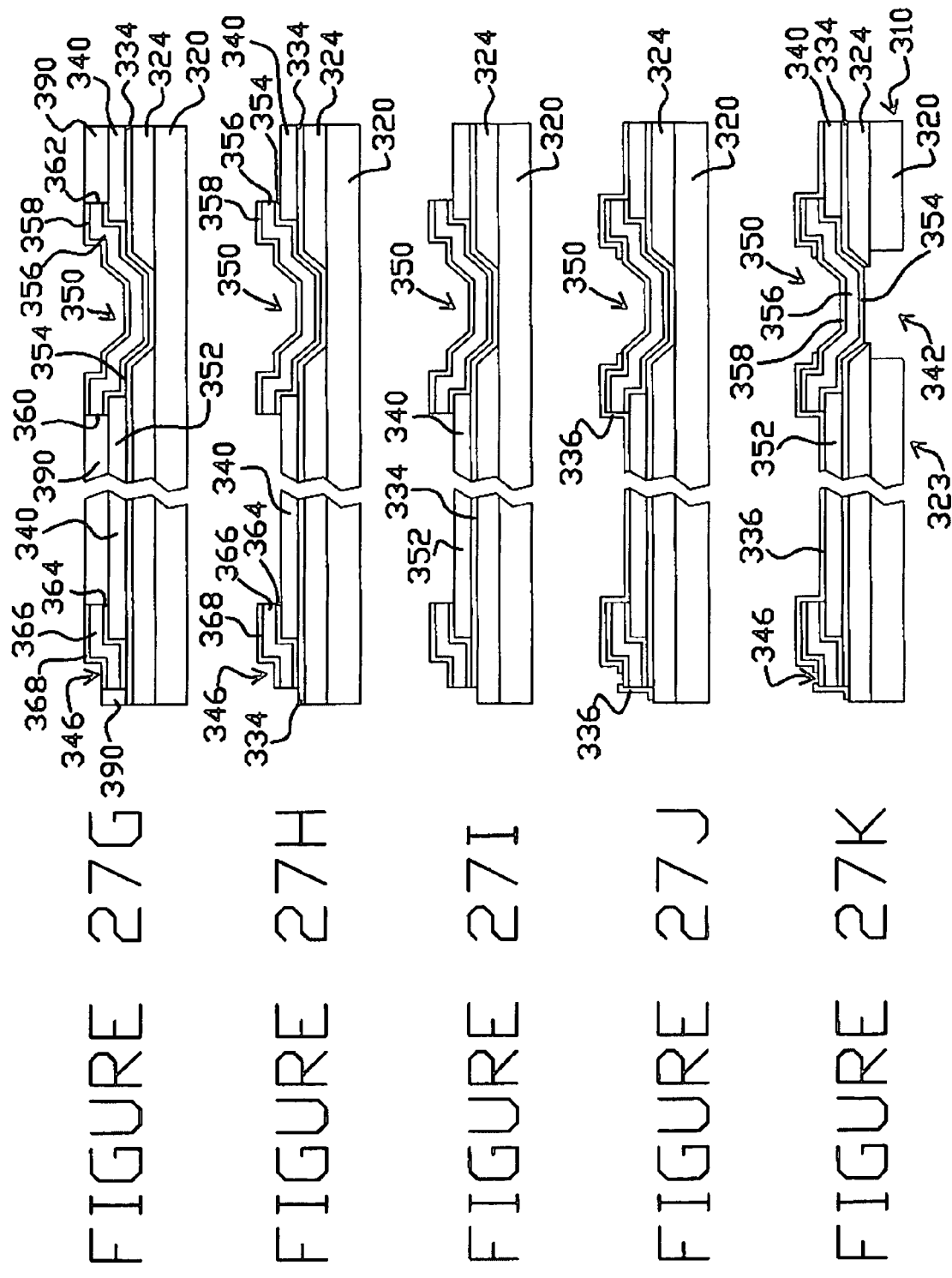

Still another subsequent step, illustrated in FIGS. 27F-H, is the step 917 of performing secondary plating operations on the conductive leads 340. Prior to the performing the secondary plating operations, a mask of resist material 390 is applied to the first major surface 321 of flexure 310 using a photolithography process to define what portions of the major surface will be exposed for subsequent plating operations.

Once the resist material 390 has been applied, the secondary plating operation is performed on the conductive leads 340 in the flying lead region 350 and a portion of at test pad portion 346 and/or the head bond pad portion (not shown) using a process of the type described above. In this embodiment, a first flying lead conductive layer 354 of flying lead region 350 of gold is plated along a path from a first end 360 to a second end 362, following a contour created by materials such as the primary conductor portions 352 previously applied to the first major surface 321 of the flexure 310. In a subsequent plating operation, a second flying lead conductive layer 356 of nickel is applied onto the first flying lead conductive layer 354. In yet another subsequent plating process, a third flying lead conductive layer 358 of gold is applied to the second flying lead conductive layer 356. It should be noted that the flying lead conductive layers 354, 356, and 358 overlap the primary conductor portions 352 to allow for misregistration during the secondary plating process as is diagrammed in FIGS. 9 and 10 in conjunction with a previously described embodiment.

While the first flying lead conductive layer 354, second flying lead conductive layer 356, and third flying lead conductive layer 358 added in the secondary plating operations are described as being gold, nickel, and gold, respectively, other materials or combinations of materials may be used, including silver, copper, and various alloys. Portions of conductive leads 340 in flying lead region 350 that are accessible along major surfaces 321 and 323 of flexure 310, however, are preferably formed of gold to advantageously provide a desired surface to which conductors (not shown) can be ultrasonically welded. After the secondary plating operations are completed, the resist material 390 is removed from the flexure 310, using processes of the type described above.

FIG. 27I illustrates a subsequent step 918 of removing that portion of the seed layer 334 from the flexure 310 that is not covered by completed conductive leads 340. The seed layer 350 is removed by etching or other known processes, leaving conductive leads 340 and dielectric layer 324 covering the first major surface 321 of flexure 310.

Referring to FIG. 27J, a subsequent step is the step 920 of applying cover layer 336 onto flexure 310. The cover layer 336 is applied primarily over primary conductor portions 352 of the conductive leads 340 and surrounding areas of the first major surface 321, leaving part of the flying lead region 350, the test pad portion 346, and the head bond pad portion (not shown) free from coverage by the cover layer. Part of the primary conductor portions 252 can also be uncovered by the cover layer 336 without departing from the scope of the invention. The cover layer 336 is applied as described above in conjunction with step 620 of method 610.

FIG. 25K illustrates the results of a subsequent step 922 of etching spring metal layer 320 and seed layer 334 away from a portion of a second major surface 323 of the flexure 310. Step 922 creates an aperture 342 that allows access to the flying lead region 350 from the second major surface 323. Additional etching may alternatively be performed to create apertures (not shown) allow access from the second major surface 323 for the test pad portion 346 and/or the head bond pad portion (not shown). Aperture 342 can be formed by photolithography and etching processes similar to those identified above with respect to FIGS. 21I-L. It should be noted that the first flying lead conductive layer 354 should be thick enough to prevent etching material from wicking up to, and compromising the integrity of, the second flying lead conductive layer 356, which may not be resistant the etchant.

Figure 28A:
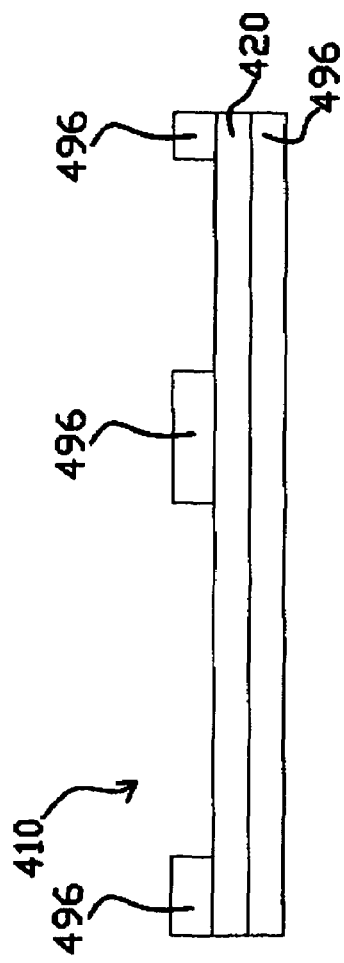
FIGS. 28A-C are side views of a flexure structure, illustrating the structure at sequential steps of a manufacturing process to apply the ground plane of FIG. 13.
Figure 28B:
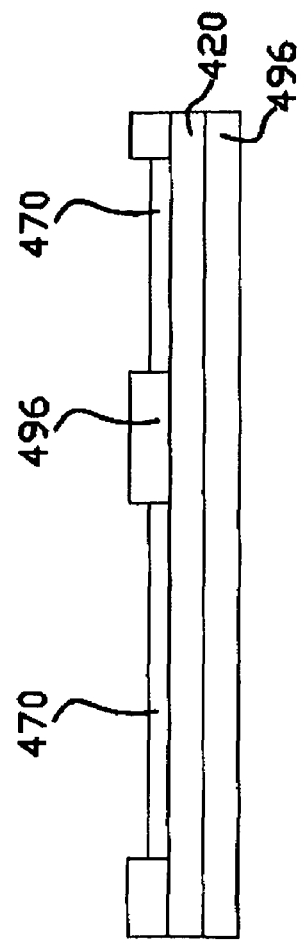
Figure 28C:
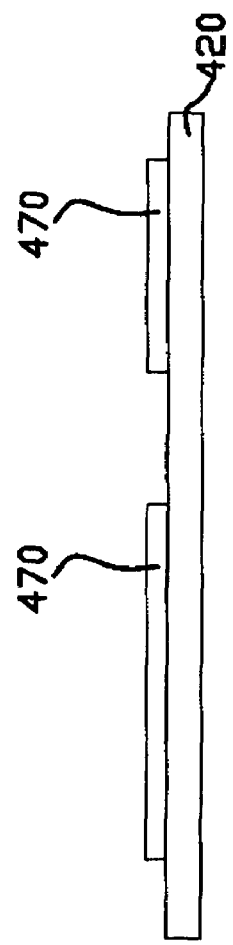

Each of the methods of manufacture described above can alternatively include a step to add a ground plane such as the ground plane 470 shown in FIG. 14 of conductive material to the flexure. For example. In each method, prior to the step of applying a dielectric material onto the spring metal layer, a layer of conductive material can be applied directly to the spring metal layer. Referring to FIGS. 28A-C, the process includes applying a mask resist material 496 using a photolithography process of the type described above onto the areas of a first major surface 421 and a second major surface 423 of spring metal layer 420 of flexure 410 where it is not desired to apply a ground plane 470. After the resist material 496 is properly cured, the ground plane layer 470 is applied to the spring metal layer 420. After the process of applying the ground plane layer has been completed, the resist material 496 is removed and subsequent steps are taken to add the remaining layers of the conductive leads as described above in multiple alternative embodiments.

The invention offers a number of advantages. The use of metals that are either non-corrosive or nearly non-corrosive provides for an improved flexure that is more robust and less reliant on coatings to prevent corrosion. Noble or near noble metals such as gold and silver are more corrosion resistant than other materials. Flying leads with a gold surface can accept ultrasonic bonding for attachment of external conductive leads such as a flex circuit to the flying leads. Further, the strengthened leads of the current invention are suitable for rework without sustaining damage. Further still, by extending the flying leads onto ends of the primary conductor portions in embodiments where the flying leads are applied in a secondary operation, the process yields a more robust conductive lead, as the chance of misregistration is minimized.

In addition, the processes of manufacturing the conductive assemblies onto the spring metal layer of the flexures described above provide important advantages and efficiencies, including improved yields, stronger flying leads, and greater flexibility in choosing materials for various portions of the conductive leads. For example, performing most of the manufacturing steps before the step of removing the spring steel layer below the flying leads and other features, allows the addition of materials onto a dimensionally stable material. This leads to superior registration as compared to processes performed after the stainless steel etch. Further, the steps of applying liquid materials (which are later cured) to form the dielectric layer or cover layer onto a continuous material results in more uniform coating. Further still, it is desirable to avoid handling the flexure after the etching process, as the part becomes fragile and floppy. Reduced post etching steps leads to reduced damage due to handling and higher yields.

Although the present invention has been described with reference to preferred embodiments, those skilled in the art will recognize that changes can be made in form and detail without departing from the spirit and scope of the invention.

What is claimed is:

1. An integrated lead flexure manufactured by an additive process, including:
   a spring metal base layer;
   a dielectric insulating layer on portions of the spring metal base layer; and
   traces, comprising:
     first trace portions including a first structure of one or more metal layers on the dielectric insulating layer over portions of the flexure backed by the spring metal base layer; and
     second trace portions including a second structure of one or more metal layers different than the first structure over portions of the flexure free from the spring metal base layer, wherein the second structure includes a layer of gold having an exposed surface facing the side of the flexure with the spring metal base layer and ends that extend over the first trace portions onto a side of the first trace portions opposite the dielectric insulating layer from the spring metal base layer.

2. The integrated lead flexure of claim 1 wherein the first trace portions include a layer from the group consisting of silver, copper or copper alloy.

3. The integrated lead flexure of claim 2 wherein the first trace portions include a layer of nickel.

4. The integrated lead flexure of claim 3 wherein the second trace portions include a layer of nickel.

5. The integrated lead flexure of claim 1 and further including strengthening structures at intersections of the first and second trace portions.

6. The integrated lead flexure of claim 1 and further including a covercoat layer over at least the first trace portions.

7. The integrated lead flexure of claim 1 wherein the second trace portions include flying leads on a tail of the flexure.

8. The integrated lead flexure of claim 1 wherein one or more metal layers of the second structure in addition to the gold layer have ends that extend over the first trace portions onto a side of the first trace portions opposite the dielectric insulating layer from the spring metal base layer.

* * * * *